(12) United States Patent
Yamazaki et al.

(10) Patent No.: US 9,922,685 B2
(45) Date of Patent: *Mar. 20, 2018

(54) SEMICONDUCTOR DEVICE AND DRIVING METHOD THEREOF

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 121 days.

This patent is subject to a terminal disclaimer.

(21) Appl. No.: 14/068,131

(22) Filed: Oct. 31, 2013

(65) Prior Publication Data
US 2014/0092681 A1    Apr. 3, 2014

Related U.S. Application Data

(62) Division of application No. 12/945,476, filed on Nov. 12, 2010, now Pat. No. 8,576,620.

(30) Foreign Application Priority Data

Nov. 13, 2009    (JP) .................................. 2009-260341

(51) Int. Cl.
*G11C 11/40*    (2006.01)
*G11C 7/06*    (2006.01)
(Continued)

(52) U.S. Cl.
CPC .............. *G11C 7/062* (2013.01); *G11C 7/067* (2013.01); *G11C 11/40* (2013.01);
(Continued)

(58) Field of Classification Search
CPC ...................................................... G11C 11/40
(Continued)

(56) References Cited

U.S. PATENT DOCUMENTS 4,408,304 A * 10/1983 Nishizawa et al. ........... 365/174
4,466,081 A    8/1984 Masuoka
(Continued)

FOREIGN PATENT DOCUMENTS

CN    101171641 A    4/2008
CN    101405814 A    4/2009
(Continued)

OTHER PUBLICATIONS

Tomoyaki Ishii et al., A Poly-Silicon TFT With a Sub-5-nm Thick Channel for Low-Power Gain Cell Memory in Mobile Applications, IEEE Transactions on Electron Devices, vol. 51, No. 11, Nov. 2004, pp. 1805-1810.*

(Continued)

*Primary Examiner* — Hoai V Ho
*Assistant Examiner* — Jay Radke
(74) *Attorney, Agent, or Firm* — Fish & Richardson P.C.

(57) ABSTRACT

A semiconductor device includes: a source line; a bit line; a word line; a memory cell connected to the bit line and the word line; a driver circuit which drives a plurality of second signal lines and a plurality of word lines so as to select the memory cell specified by an address signal; a potential generating circuit which generates a writing potential and a plurality of reading potentials to supply to a writing circuit and a reading circuit; and a control circuit which selects one of a plurality of voltages for correction on a basis of results of the reading circuit comparing a potential of the bit line with the plurality of reading potentials.

18 Claims, 22 Drawing Sheets

(51) Int. Cl.
  *H01L 27/06* (2006.01)
  *H01L 27/105* (2006.01)
  *H01L 27/11519* (2017.01)
  *H01L 27/11521* (2017.01)
  *H01L 27/11524* (2017.01)
  *H01L 27/11551* (2017.01)
  *H01L 27/1156* (2017.01)
  *H01L 27/12* (2006.01)
  *H01L 29/15* (2006.01)
  *H01L 29/205* (2006.01)
  *H01L 21/02* (2006.01)

(52) U.S. Cl.
  CPC ........ *H01L 27/0688* (2013.01); *H01L 27/105* (2013.01); *H01L 27/1156* (2013.01); *H01L 27/11519* (2013.01); *H01L 27/11521* (2013.01); *H01L 27/11524* (2013.01); *H01L 27/11551* (2013.01); *H01L 27/1203* (2013.01); *H01L 27/1225* (2013.01); *H01L 29/155* (2013.01); *H01L 29/205* (2013.01); *G11C 2207/005* (2013.01); *H01L 21/02554* (2013.01); *H01L 21/02565* (2013.01); *H01L 21/02631* (2013.01)

(58) Field of Classification Search
  USPC .................................................. 365/182, 187
  See application file for complete search history.

(56) References Cited

U.S. PATENT DOCUMENTS

| | | |
|---|---|---|
| 4,633,438 A * | 12/1986 | Kume et al. ............ 365/51 |
| 5,349,366 A | 9/1994 | Yamazaki et al. |
| 5,594,698 A * | 1/1997 | Freeman ............ 365/222 |
| 5,731,856 A | 3/1998 | Kim et al. |
| 5,744,864 A | 4/1998 | Cillessen et al. |
| 5,751,634 A * | 5/1998 | Itoh ............ 365/185.17 |
| 5,940,705 A | 8/1999 | Lee et al. |
| 5,995,410 A * | 11/1999 | Forbes ............ G11C 11/404 365/149 |
| 6,016,268 A * | 1/2000 | Worley ............ G11C 11/565 365/149 |
| 6,191,977 B1 | 2/2001 | Lee |
| 6,294,274 B1 | 9/2001 | Kawazoe et al. |
| 6,560,142 B1 * | 5/2003 | Ando ............ 365/177 |
| 6,563,174 B2 | 5/2003 | Kawasaki et al. |
| 6,576,943 B1 | 6/2003 | Ishii et al. |
| 6,577,530 B2 | 6/2003 | Muranaka et al. |
| 6,646,300 B2 | 11/2003 | Ishii et al. |
| 6,727,522 B1 | 4/2004 | Kawasaki et al. |
| 6,809,979 B1 * | 10/2004 | Tang ............ 365/222 |
| 6,825,525 B2 | 11/2004 | Ishii et al. |
| 6,873,009 B2 | 3/2005 | Hisamoto et al. |
| 6,876,023 B2 | 4/2005 | Ishii et al. |
| 7,009,243 B2 | 3/2006 | Ishii et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager et al. |
| 7,375,399 B2 | 5/2008 | Ishii et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,440,331 B2 | 10/2008 | Hemink |
| 7,453,065 B2 | 11/2008 | Saito et al. |
| 7,453,087 B2 | 11/2008 | Iwasaki |
| 7,457,163 B2 | 11/2008 | Hemink |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,842,989 B2 | 11/2010 | Kato |
| 7,843,739 B2 | 11/2010 | Hemink |
| 7,851,792 B2 | 12/2010 | Aiba et al. |
| 7,888,207 B2 | 2/2011 | Wager et al. |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,993,964 B2 | 8/2011 | Hirao et al. |
| 8,014,205 B2 | 9/2011 | Hemink |
| 8,103,920 B2 | 1/2012 | Nagadomi |
| 8,154,024 B2 | 4/2012 | Iwasaki |
| 8,274,077 B2 | 9/2012 | Akimoto et al. |
| 8,289,753 B2 | 10/2012 | Yamazaki et al. |
| 8,319,218 B2 | 11/2012 | Yamazaki et al. |
| 8,466,463 B2 | 6/2013 | Akimoto et al. |
| 8,492,862 B2 | 7/2013 | Yamazaki et al. |
| 8,502,217 B2 | 8/2013 | Sato et al. |
| 8,559,220 B2 | 10/2013 | Yamazaki et al. |
| 8,624,245 B2 | 1/2014 | Yamazaki |
| 8,629,069 B2 | 1/2014 | Akimoto et al. |
| 8,669,550 B2 | 3/2014 | Akimoto et al. |
| 8,896,042 B2 | 11/2014 | Yamazaki et al. |
| 8,937,020 B2 | 1/2015 | Yamazaki et al. |
| 9,105,511 B2 | 8/2015 | Yamazaki et al. |
| 2001/0046027 A1 | 11/2001 | Tai et al. |
| 2002/0056838 A1 | 5/2002 | Ogawa |
| 2002/0071308 A1 | 6/2002 | Muranaka et al. |
| 2002/0132454 A1 | 9/2002 | Ohtsu et al. |
| 2003/0047785 A1 * | 3/2003 | Kawasaki ........ H01L 29/66969 257/350 |
| 2003/0185040 A1 * | 10/2003 | Rickes ............ H01L 27/0688 365/145 |
| 2003/0189401 A1 | 10/2003 | Kido et al. |
| 2003/0209739 A1 | 11/2003 | Hisamoto et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205975 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0120165 A1 * | 6/2006 | Hemink ............ 365/185.28 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0221692 A1 | 10/2006 | Chen |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001205 A1 * | 1/2007 | Kimura ............ G09G 3/3241 257/296 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |

(56) References Cited

U.S. PATENT DOCUMENTS

| | | |
|---|---|---|
| 2007/0108446 A1 | 5/2007 | Akimoto |
| 2007/0126044 A1* | 6/2007 | Shioya .................. B82Y 10/00 257/306 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0094891 A1* | 4/2008 | Ho ...................... G11C 11/5642 365/185.03 |
| 2008/0106191 A1 | 5/2008 | Kawase |
| 2008/0108198 A1 | 5/2008 | Wager et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0175054 A1* | 7/2008 | Hancock ............. G11C 11/5671 365/185.09 |
| 2008/0182358 A1 | 7/2008 | Cowdery-Corvan et al. |
| 2008/0224133 A1 | 9/2008 | Park et al. |
| 2008/0239822 A1* | 10/2008 | Kosaki et al. ........... 365/185.17 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1* | 6/2009 | Umeda ..................... C30B 1/02 252/500 |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0136743 A1 | 6/2010 | Akimoto et al. |
| 2010/0193785 A1 | 8/2010 | Kimura |
| 2010/0264419 A1 | 10/2010 | Iwasaki et al. |
| 2011/0101339 A1 | 5/2011 | Yamazaki et al. |
| 2011/0101352 A1 | 5/2011 | Hosono et al. |
| 2011/0104851 A1 | 5/2011 | Akimoto et al. |
| 2011/0110145 A1 | 5/2011 | Yamazaki et al. |
| 2011/0117697 A1 | 5/2011 | Akimoto et al. |
| 2011/0121290 A1 | 5/2011 | Akimoto et al. |
| 2011/0128777 A1 | 6/2011 | Yamazaki et al. |
| 2011/0201162 A1 | 8/2011 | Hosono et al. |
| 2011/0255325 A1 | 10/2011 | Nagatsuka et al. |
| 2012/0012838 A1 | 1/2012 | Hosono et al. |
| 2013/0062601 A1 | 3/2013 | Yamazaki et al. |
| 2014/0106506 A1 | 4/2014 | Yamazaki |
| 2015/0136594 A1 | 5/2015 | Yamazaki et al. |
| 2015/0325596 A1 | 11/2015 | Yamazaki et al. |

FOREIGN PATENT DOCUMENTS

| | | |
|---|---|---|
| EP | 0 049 326 A1 | 4/1982 |
| EP | 1 737 044 A1 | 12/2006 |
| EP | 1770788 A | 4/2007 |
| EP | 1812969 A | 8/2007 |
| EP | 1995787 A | 11/2008 |
| EP | 1998373 A | 12/2008 |
| EP | 1998374 A | 12/2008 |
| EP | 1998375 A | 12/2008 |
| EP | 2 226 847 A2 | 9/2010 |
| EP | 2 246 894 A1 | 11/2010 |
| EP | 2339639 A | 6/2011 |
| EP | 2 413 366 A1 | 2/2012 |
| EP | 2453480 A | 5/2012 |
| EP | 2453481 A | 5/2012 |
| EP | 2455975 A | 5/2012 |
| EP | 2816607 A | 12/2014 |
| JP | 57-105889 A | 7/1982 |
| JP | 60-198861 A | 10/1985 |
| JP | 62-274773 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 5-119298 A | 5/1993 |
| JP | 05-251705 A | 9/1993 |
| JP | 07-037393 A | 2/1995 |
| JP | 07-211084 A | 8/1995 |
| JP | 08-264794 A | 10/1996 |
| JP | 11-505377 A | 5/1999 |
| JP | 2000-044236 A | 2/2000 |
| JP | 2000-113686 A | 4/2000 |
| JP | 2000-150900 A | 5/2000 |
| JP | 2000-269457 A | 9/2000 |
| JP | 2002-076356 A | 3/2002 |
| JP | 2002-094029 A | 3/2002 |
| JP | 2002-133876 A | 5/2002 |
| JP | 2002-289859 A | 10/2002 |
| JP | 2002-368226 A | 12/2002 |
| JP | 2003-086000 A | 3/2003 |
| JP | 2003-086808 | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-050424 A | 2/2005 |
| JP | 2005-268662 A | 9/2005 |
| JP | 2006-012878 A | 1/2006 |
| JP | 2006-502597 A | 1/2006 |
| JP | 2006-165529 A | 6/2006 |
| JP | 2006-165532 A | 6/2006 |
| JP | 2007-103918 A | 4/2007 |
| JP | 2007-123861 A | 5/2007 |
| JP | 2007-158307 A | 6/2007 |
| JP | 2009-033145 A | 2/2009 |
| JP | 2009-141002 A | 6/2009 |
| JP | 2009-158528 A | 7/2009 |
| JP | 2009-164473 A | 7/2009 |
| JP | 2009-176864 A | 8/2009 |
| JP | 2009-182194 A | 8/2009 |
| JP | 2009-528670 | 8/2009 |
| JP | 2011-100979 A | 5/2011 |
| JP | 2011-119675 A | 6/2011 |
| JP | 2011-119713 A | 6/2011 |
| JP | 2011-122238 A | 6/2011 |
| JP | 2011-135065 A | 7/2011 |
| JP | 2011-139054 A | 7/2011 |
| JP | 2012-064286 A | 3/2012 |
| JP | 2014-203505 A | 10/2014 |
| KR | 10-0339023 | 9/2002 |
| WO | WO 2000/070683 A1 | 11/2000 |
| WO | WO 20041038757 A2 | 5/2004 |
| WO | WO 20041114391 A1 | 12/2004 |
| WO | 2005/088726 A1 | 9/2005 |
| WO | WO-2006/051993 | 5/2006 |
| WO | WO-2006/107654 | 10/2006 |
| WO | WO-2007/029844 | 3/2007 |
| WO | WO-2007/055256 | 5/2007 |
| WO | WO-2007/142167 | 12/2007 |
| WO | WO-2007/143398 | 12/2007 |

(56) References Cited

FOREIGN PATENT DOCUMENTS

| WO | WO-2009/034953 | 3/2009 |
|---|---|---|
| WO | WO-2009/072532 | 6/2009 |
| WO | WO 20091093724 A1 | 7/2009 |
| WO | WO-2009/107443 | 9/2009 |
| WO | 2011/043176 A1 | 4/2011 |
| WO | 2011/052488 A1 | 5/2011 |
| WO | WO 2011/055669 A1 | 5/2011 |
| WO | WO-2011/058882 | 5/2011 |
| WO | WO-2011/065258 | 6/2011 |
| WO | WO-2011/068066 | 6/2011 |

OTHER PUBLICATIONS

International Search Report (International Application No. PCT/JP2010/069773) dated Feb. 15, 2011.
Written Opinion (International Application No. PCT/JP2010/069773) dated Feb. 15, 2011.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

(56) References Cited

OTHER PUBLICATIONS

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Chinese Office Action (Application No. 201080051076.7) dated Aug. 5, 2014.

Korean Office Action (Application No. 2012-7015026) dated Jun. 21, 2017.

Korean Office Action (Application No. 2012-7015026) dated Dec. 28, 2017.

* cited by examiner

Energy band diagram of B-B' section ($V_G>0$)

Energy band diagram of B-B' section ($V_G<0$)

SEMICONDUCTOR DEVICE AND DRIVING METHOD THEREOF

CROSS-REFERENCE TO RELATED APPLICATIONS

This application is a divisional of U.S. application Ser. No. 12/945,476, filed Nov. 12, 2010, now allowed, which claims the benefit of a foreign priority application filed in Japan as Serial No. 2009-260341 on Nov. 13, 2009, both of which are incorporated by reference.

TECHNICAL FIELD

The present invention relates to a semiconductor device using a semiconductor element, a method for manufacturing the semiconductor device, and a method for driving the semiconductor device.

BACKGROUND ART

Storage devices using semiconductor elements are broadly classified into two categories: a volatile storage device that loses stored data when power supply stops, and a non-volatile storage device that holds stored data even when power supply stops.

A typical example of a volatile storage device is a DRAM (dynamic random access memory). A DRAM stores data in such a manner that a transistor included in a storage element is selected and electric charge is stored in a capacitor.

Electric charge in the capacitor is lost by reading data from DRAM on the above-described principle; thus, writing operation is necessary every time data is read out. Moreover, the transistor included in the storage element has a leakage current and electric charge flows into or out of the capacitor even when the transistor is not selected, so that the data holding time is short. For that reason, writing operation (refresh operation) is necessary at predetermined intervals, and it is difficult to sufficiently reduce power consumption. Furthermore, since stored data is lost when power supply stops, another storage device using a magnetic material or an optical material is further needed in order to hold data for a long time.

Another example of a volatile storage device is an SRAM (static random access memory). An SRAM holds stored data by using a circuit such as a flip-flop and thus does not need refresh operation, which is an advantage over a DRAM. However, cost per storage capacitance is high because the circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates due to tunneling current generated in writing data, so that the storage element stops its function after a predetermined frequency of writing data. In order to reduce adverse effects of this problem, a method in which the frequencies of writing data for storage elements are equalized is employed, for example. However, this method involves a complicated peripheral circuit. Moreover, employing such a method does not solve the fundamental problem of lifetime. In other words, a flash memory is not suitable for applications in which data is frequently rewritten.

In addition, high voltage is necessary for holding electric charge in the floating gate or removing the electric charge. Further, it takes a relatively long time to hold or remove electric charge, and it is not easy to perform writing or erasing data at higher speed.

Further, a so-called multi-valued memory which holds a plurality of states in one storage element involves a complicated circuit in order to secure the accuracy of the writing, which causes reduction in the operation speed.

REFERENCE

Patent Document 1: Japanese Published Patent Application No. S57-105889

DISCLOSURE OF INVENTION

In view of the foregoing problems, an object of one embodiment of the present invention is to provide a semiconductor device with a structure in which stored data can be held even when power is not supplied, and there is no limitation on the frequency of writing data.

An object of one embodiment of the present invention is to provide a semiconductor device in which the adverse effect of variation on the threshold voltage of the transistor is suppressed and a plurality of states (e.g., states of three or more) are distinguished clearly and easily.

One embodiment of the present invention is a semiconductor device having a stacked-layer structure of a transistor formed using an oxide semiconductor (an oxide that is a semiconductor) and a transistor formed using a material other than the oxide semiconductor.

One embodiment of the present invention is a semiconductor device including a circuit which selects a voltage for correction on the basis of a comparison result between the potential of a bit line and a potential which is read out such that a plurality of states (e.g., states of three or more) are distinguished clearly and easily.

For example, the semiconductor device can employ the structure described below.

One embodiment of the present invention is a semiconductor device including: a source line; a bit line; a word line; a memory cell connected to the bit line and the word line; a driver circuit for second signal lines and word lines which drives the plurality of second signal lines and the plurality of word lines so as to select the memory cell specified by an address signal which is input; a writing circuit which outputs a writing potential to a first signal line; a reading circuit which compares a potential of the bit line, which is input from the bit line connected to the specified memory cell with a plurality of reading potentials; a control circuit which selects one of a plurality of voltages for correction on the basis of the comparison results between the potential of the bit line and the plurality of reading potentials; and a potential generating circuit which generates the writing potential and the plurality of reading potentials to supply to the writing circuit and the reading circuit.

One embodiment of the present invention is a semiconductor device including: a source line; a bit line; a word line; a memory cell connected to the bit line and the word line; a driver circuit for second signal lines and word lines which drives the plurality of second signal lines and the plurality of word lines so as to select the memory cell specified by an address signal which is input; a writing circuit which outputs a first writing potential to a first signal line in a first writing operation and outputs one of a plurality of second writing potentials to the first signal line in a second writing operation; a reading circuit which compares a first potential of the bit line, which is input from the bit line connected to the specified memory cell with a plurality of first reading potentials in a first reading operation and compares a second potential of the bit line, which is input from the bit line connected to the specified memory cell with a plurality of second reading potentials in a second reading operation to read out data of the memory cell; a control circuit which selects one of a plurality of voltages for correction on the basis of the comparison results between the first potential of the bit line and the plurality of first reading potentials and selects one of the plurality of second writing potentials; and a potential generating circuit which generates the first writing potential, the plurality of second writing potentials, the plurality of first reading potentials, and the plurality of second reading potentials to supply to the writing circuit and the reading circuit.

One embodiment of the present invention is a semiconductor device including: a source line; a bit line; a first signal line; a plurality of second signal lines; a plurality of word lines; a plurality of memory cells connected in parallel between the source line and the bit line; a driver circuit for second signal lines and word lines which drives the plurality of second signal lines and the plurality of word lines so as to select the memory cell specified by an address signal which is input; a writing circuit which outputs a writing potential to the first signal line; a reading circuit which compares a potential of the bit line, which is input from the bit line connected to the specified memory cell with a plurality of reading potentials; a control circuit which selects one of a plurality of voltages for correction on the basis of the comparison results between the potential of the bit line and the plurality of reading potentials; and a potential generating circuit which generates the writing potential and the plurality of reading potentials to supply to the writing circuit and the reading circuit. One of the plurality of memory cells includes: a first transistor which includes a first gate electrode, a first source electrode, and a first drain electrode; a second transistor which includes a second gate electrode, a second source electrode, and a second drain electrode; and a third transistor which includes a third gate electrode, a third source electrode, and a third drain electrode. The first transistor is provided for a substrate containing a semiconductor material, and the second transistor includes an oxide semiconductor layer. The first gate electrode is electrically connected to one of the second source electrode or the second drain electrode; the source line is electrically connected to the first source electrode; the first drain electrode is electrically connected to the third source electrode; the bit line is electrically connected to the third drain electrode; the first signal line is electrically connected to the other of the second source electrode or the second drain electrode; one of the plurality of the second signal lines is electrically connected to the second gate electrode; and one of the plurality of word lines is electrically connected to the third gate electrode.

One embodiment of the present invention is a semiconductor device including: a source line; a bit line; a first signal line; a plurality of second signal lines; a plurality of word lines; a plurality of memory cells connected in parallel between the source line and the bit line; a driver circuit for second signal lines and word lines which drives the plurality of second signal lines and the plurality of word lines so as to select the memory cell specified by an address signal which is input; a writing circuit which outputs a first writing potential to the first signal line in a first writing operation and outputs one of the plurality of second writing potentials to the first signal line in a second writing operation; a reading circuit which compares a first potential of the bit line, which is input from the bit line connected to the specified memory cell with a plurality of first reading potentials in a first reading operation and compares a second potential of the bit line, which is input from the bit line connected to the specified memory cell with a plurality of second reading potentials in a second reading operation to read out data of the memory cell; a control circuit which selects one of a plurality of voltages for correction on the basis of the comparison results between the first potential of the bit line and the plurality of first reading potentials and selects one of the plurality of second writing potentials; and a potential generating circuit which generates the first writing potential, the plurality of second writing potentials, the plurality of first reading potentials, and the plurality of second reading potentials to supply to the writing circuit and the reading circuit. One of the plurality of memory cells includes: a first transistor which includes a first gate electrode, a first source electrode, and a first drain electrode; a second transistor which includes a second gate electrode, a second source electrode, and a second drain electrode; and a third transistor which includes a third gate electrode, a third source electrode, and a third drain electrode. The first transistor is provided for a substrate containing a semiconductor material, and the second transistor includes an oxide semiconductor layer. The first gate electrode is electrically connected to one of the second source electrode or the second drain electrode; the source line is electrically connected to the first source electrode; the first drain electrode is electrically connected to the third source electrode; the bit line is electrically connected to the third drain electrode; the first signal line is electrically connected to the other of the second source electrode or the second drain electrode; one of the plurality of the second signal lines is electrically connected to the second gate electrode; and one of the plurality of word lines is electrically connected to the third gate electrode.

In the above-described structure, the first transistor may include a channel formation region provided for the substrate containing the semiconductor material, impurity regions provided so as to sandwich the channel formation region, a first gate insulating layer over the channel formation region, the first gate electrode over the first gate insulating layer, and the first source electrode and the first drain electrode electrically connected to the impurity regions.

In the above-described structure, the second transistor may include the second gate electrode over the substrate containing the semiconductor material, a second gate insulating layer over the second gate electrode, the oxide semiconductor layer over the second gate insulating layer, and the second source electrode and the second drain electrode electrically connected to the oxide semiconductor layer.

In the above-described structure, it is preferable to employ a single crystal semiconductor substrate or an SOI substrate as the substrate containing the semiconductor material. In particular, it is preferable that the semiconductor material be silicon.

In the above-described structure, it is preferable that the oxide semiconductor layer contain an In—Ga—Zn—O-based oxide semiconductor material. The oxide semiconductor layer may contain a crystal of $In_2Ga_2ZnO_7$. Further, it is preferable that the hydrogen concentration of the oxide semiconductor layer be $5\times10^{19}$ atoms/cm$^3$ or less. It is preferable that the off-state current of the second transistor be $1\times10^{-13}$ A or less.

Note that in this specification and the like, the terms "over" and "below" do not necessarily means the positions "directly on" and "directly under", respectively. For example, the expression "a first gate electrode over a gate insulating layer" does not exclude the case where a component is placed between the gate insulating layer and the first gate electrode. Further, the terms "over" and "below" are only used for convenience of description and can be switched to each other in the case where the positional relation is reversed, unless otherwise specified.

In addition, in this specification and the like, the terms "electrode" and "wiring" do not have functional limitation. For example, an "electrode" is sometimes used as part of a "wiring", and vice versa. Furthermore, the term "electrode" or "wiring" can also mean a plurality of "electrodes" or "wirings" formed in an integrated manner.

Further, functions of a "source" and a "drain" are sometimes switched to each other when a transistor having an opposite polarity is used or when the direction of current flowing is changed in circuit operation, for example. Therefore, the terms "source" and "drain" can be replaced with each other in this specification and the like.

In this specification and the like, the term "electrically connected" can mean connection with an object having any electric function provided therebetween. There is no particular limitation on the object having any electric function as long as electric signals can be transmitted and received through it.

Examples of the object having any electric function are a switching element such as a transistor, a resistor, an inductor, a capacitor, and an element with a variety of functions in addition to an electrode and a wiring.

In general, the term "SOI substrate" means a substrate where a silicon semiconductor layer is provided on an insulating surface; however, in this specification and the like, the term "SOI substrate" also includes in its category a substrate where a semiconductor layer formed using a material other than silicon is provided over an insulating surface. That is, the semiconductor layer included in the "SOI substrate" is not limited to a silicon semiconductor layer. A substrate in the "SOI substrate" is not limited to a semiconductor substrate such as a silicon wafer and can include in its category a non-semiconductor substrate such as a glass substrate, a quartz substrate, a sapphire substrate, or a metal substrate. In other words, the "SOI substrate" also includes in its category a conductive substrate having an insulating surface and an insulating substrate provided with a layer formed of a semiconductor material. In addition, in this specification and the like, the term "semiconductor substrate" means not only a substrate formed using only a semiconductor material but also any substrate including a semiconductor material. That is, in this specification and the like, the "SOI substrate" is also included in the category of the "semiconductor substrate".

According to one embodiment of the present invention, a semiconductor device in which a transistor using a material other than an oxide semiconductor is placed in a lower portion and a transistor using an oxide semiconductor is placed in an upper portion is provided.

Since the off-state current of a transistor using an oxide semiconductor is extremely low, stored data can be held for an extremely long time by using the transistor. In other words, power consumption can be adequately reduced because refresh operation becomes unnecessary or the frequency of refresh operation can be extremely low. Moreover, stored data can be held for a long time even when power is not supplied.

Further, data can be written without high voltage, and deterioration of the element is not caused. Furthermore, since data is written depending on the on/off state of the transistor, high-speed operation can be easily realized. In addition, there is no need of operation for erasing data.

Further, since a transistor using a material other than an oxide semiconductor can operate at higher speed than a transistor using an oxide semiconductor, stored data can be read out at high speed by using the transistor.

According to one embodiment of the present invention, a voltage for correction is selected on the basis of the comparison result between the potential of the bit line and the potential read out, so that a plurality of states (for example, states of three or more) can be distinguished accurately and easily. Accordingly, a multi-valued type semiconductor device with excellent characteristics can be provided.

In this manner, both the transistor using a material other than an oxide semiconductor and the transistor using an oxide semiconductor are provided and a circuit which selects a voltage for correction on the basis of the potential of the bit line and the potential read out is provided, so that a semiconductor device with a novel feature can be realized.

BEST MODE FOR CARRYING OUT THE INVENTION

Figure 1:
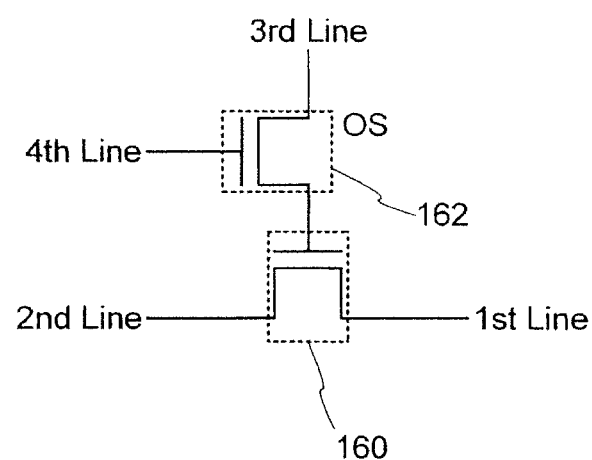
FIG. 1 is a circuit diagram illustrating a semiconductor device.

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, the size, the range, or the like of each structure illustrated in drawings and the like is not accurately represented in some cases for easy understanding. Therefore, embodiments of the present invention are not necessarily limited to such a position, size, range, or the like disclosed in the drawings and the like.

In addition, in this specification and the like, ordinal numbers such as "first", "second", and "third" are used in order to avoid confusion among components, and the terms do not have numeral limitation.

Embodiment 1

In Embodiment 1, structures and a manufacturing method of a semiconductor device according to one embodiment of the present invention will be described with reference to FIG. 1, FIGS. 2A and 2B, FIGS. 3A to 3H, FIGS. 4A to 4G, FIGS. 5A to 5D, FIG. 6, FIGS. 7A and 7B, FIGS. 8A and 8B, FIG. 9, FIG. 10, FIGS. 11A and 11B, FIGS. 12A and 12B, and FIGS. 13A and 13B.

<Circuit Configuration of Semiconductor Device>

FIG. 1 illustrates an example of a circuit configuration of a semiconductor device. The semiconductor device includes a transistor 160 using a material other than an oxide semiconductor, and a transistor 162 using an oxide semiconductor. In FIG. 1, reference symbol OS is denoted for clear description of an oxide semiconductor which is used for the transistor 162.

A gate electrode of the transistor 160 is electrically connected to one of a source electrode or a drain electrode of the transistor 162. A first wiring (a 1st line, also referred to as a source line) is electrically connected to a source electrode of the transistor 160. A second wiring (a 2nd line, also referred to as a bit line) is electrically connected to a drain electrode of the transistor 160. A third wiring (a 3rd line, also referred to as a first signal line) is electrically connected to the other of the source electrode or the drain electrode of the transistor 162. A fourth wiring (a 4th line, also referred to as a second signal line) is electrically connected to a gate electrode of the transistor 162.

Since the transistor 160 using a material other than an oxide semiconductor can operate at higher speed in comparison with the transistor using an oxide semiconductor, stored data can be read at high speed by using the transistor 160. Moreover, the transistor 162 using an oxide semiconductor has a feature of extremely low off-state current. For that reason, the potential of the gate electrode of the transistor 160 can be held for an extremely long time by turning off the transistor 162.

Writing, holding, and reading of data can be performed in the manner described below, using the advantage that the potential of the gate electrode can be held.

First, writing and holding of data are described. First, the potential of the fourth wiring is set to a potential at which the transistor 162 is turned on, so that the transistor 162 is turned on. Thus, the potential of the third wiring is supplied to the gate electrode of the transistor 160 (writing). After that, the potential of the fourth wiring is set to a potential at which the transistor 162 is turned off, so that the transistor 162 is turned off, whereby the potential of the gate electrode of the transistor 160 is held (holding).

Since the off-state current of the transistor 162 is extremely low, the potential of the gate electrode of the transistor 160 is held for a long time. For example, when the potential of the gate electrode of the transistor 160 is a potential at which the transistor 160 is turned on, the on state of the transistor 160 is kept for a long time. On the other hand, when the potential of the gate electrode of the transistor 160 is a potential at which the transistor 160 is turned off, the off state of the transistor 160 is kept for a long time.

Next, reading of data is described. When a predetermined potential (a low potential) is supplied to the first wiring in the state where the on state or the off state of the transistor 160 is kept as described above, the potential of the second wiring varies depending on whether the transistor 160 is on or off. For example, when the transistor 160 is on, the potential of the second wiring is decreased in accordance with the potential of the first wiring. In contrast, when the transistor 160 is off, the potential of the second wiring is not changed.

In this manner, the potential of the second wiring is compared with a predetermined potential in the state where data is held, whereby the data can be read out.

Next, rewriting of data is described. Rewriting of data is performed in a manner similar to that of the writing and holding of data. That is, the potential of the fourth wiring is set to a potential at which the transistor 162 is turned on, so that the transistor 162 is turned on. Thus, the potential of the third wiring (a potential for new data) is supplied to the gate electrode of the transistor 160. After that, the potential of the fourth wiring is set to a potential at which the transistor 162 is turned off, so that the transistor 162 is turned off, whereby the new data is stored.

In the semiconductor device in accordance with the present invention, data can be directly rewritten to a memory cell by writing of data again as described above. For that reason, any erasing operation, where an initial data of "1" or "0" is written to the cell before writing the data, which is necessary for a flash memory or the like, is not needed. Consequently, there is an increase in operation speed since there is no erasing operation. That is, high-speed operation of the semiconductor device can be realized.

Although an n-channel transistor in which electrons are majority carriers is used in the above description, it is needless to say that a p-channel transistor in which holes are majority carriers can be used instead of the n-channel transistor.

Further, any other component can be added to the above-described structure. For example, a capacitor may be connected to the gate electrode of the transistor 160 or the source electrode or the drain electrode of the transistor 162 so that a tolerance for the potential fluctuation is improved.

<Planar Structure and Cross-Sectional Structure of Semiconductor Device>

Figure 2A:
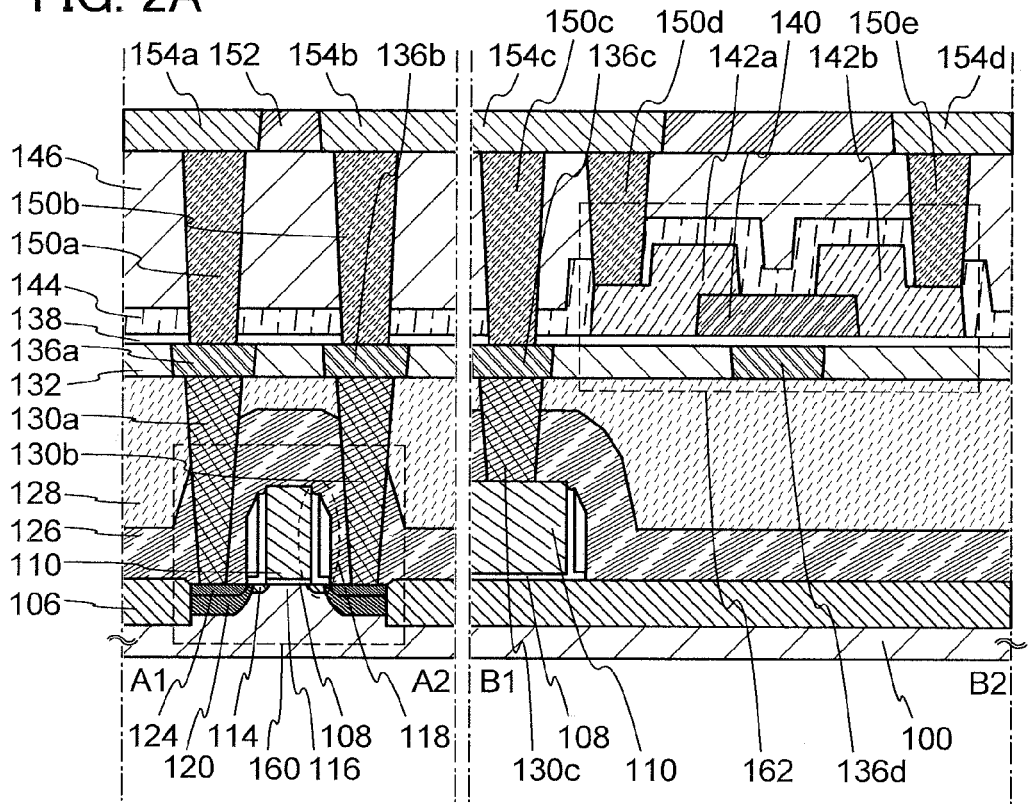
FIGS. 2A and 2B are a cross-sectional view and a plan view for illustrating a semiconductor device.
Figure 2B:
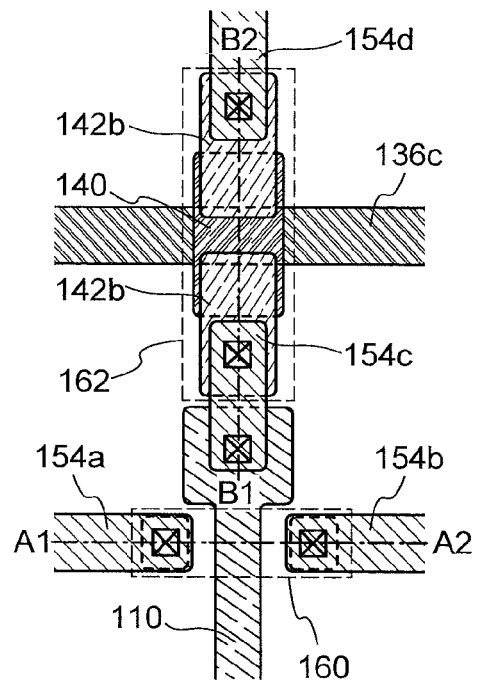

FIGS. 2A and 2B illustrate an example of a structure of the semiconductor device illustrated in FIG. 1. FIG. 2A illustrates a cross section of the semiconductor device, and FIG. 2B illustrates a plan view of the semiconductor device. FIG. 2A corresponds to a cross section along line A1-A2 and line B1-B2 in FIG. 2B. The semiconductor device illustrated in FIGS. 2A and 2B includes the transistor 160 using a material other than an oxide semiconductor in a lower portion, and the transistor 162 using an oxide semiconductor in an upper portion. Although the transistors 160 and 162 are n-channel transistors, a p-channel transistor may be used. In particular, it is easy to use a p-channel transistor as the transistor 160.

The transistor 160 includes a channel formation region 116 provided in a substrate 100 containing a semiconductor material, impurity regions 114 and high-concentration impurity regions 120 (these regions can be collectively referred to simply as impurity regions) provided so as to sandwich the channel formation region 116, a gate insulating layer 108 provided over the channel formation region 116, a gate electrode 110 provided over the gate insulating layer 108, and one of a source electrode or a drain electrode 130a and the other of the source electrode or the drain electrode 130b electrically connected to the impurity regions 114.

A sidewall insulating layer 118 is provided on a side surface of the gate electrode 110. The high-concentration impurity region 120 is placed in a region of the substrate 100 that does not overlap with the sidewall insulating layer 118 when seen in the cross-sectional view. A metal compound region 124 is placed over the high-concentration impurity region 120. An element isolation insulating layer 106 is provided over the substrate 100 so as to surround the transistor 160. An interlayer insulating layer 126 and an interlayer insulating layer 128 are provided so as to cover the transistor 160. The source and drain electrodes 130a and 130b each are electrically connected to the metal compound region 124 through an opening formed in the interlayer insulating layers 126 and 128. That is, each of the source and drain electrodes 130a and 130b is electrically connected to the high-concentration impurity region 120 and the impurity region 114 through the metal compound region 124. An electrode 130c that is provided in a manner similar to that of the source and drain electrodes 130a and 130b is electrically connected to the gate electrode 110.

The transistor 162 includes a gate electrode 136d provided over the interlayer insulating layer 128, a gate insulating layer 138 provided over the gate electrode 136d, an oxide semiconductor layer 140 provided over the gate insulating layer 138, and one of a source electrode or a drain electrode 142a and the other of the source electrode or the drain electrode 142b that are provided over the oxide semiconductor layer 140 and electrically connected to the oxide semiconductor layer 140.

The gate electrode 136d is provided so as to be embedded in an insulating layer 132 formed over the interlayer insulating layer 128. Like the gate electrode 136d, an electrode 136a, an electrode 136b, and an electrode 136c are formed in contact with the source or drain electrode 130a, the source or drain electrode 130b, and the electrode 130c, respectively.

A protective insulating layer 144 is provided over the transistor 162 so as to be in contact with part of the oxide semiconductor layer 140. An interlayer insulating layer 146 is provided over the protective insulating layer 144. Openings that reach the source or drain electrode 142a or the source or drain electrode 142b are formed in the protective insulating layer 144 and the interlayer insulating layer 146. An electrode 150d and an electrode 150e are formed in contact with the source or drain electrode 142a and the source or drain electrode 142b, respectively, through the respective openings. Like the electrodes 150d and 150e, an electrode 150a, an electrode 150b, and an electrode 150c are formed in contact with the electrode 136a, the electrode 136b, and the electrode 136c, respectively, through openings provided in the gate insulating layer 138, the protective insulating layer 144, and the interlayer insulating layer 146.

It is preferable that the oxide semiconductor layer 140 be a highly purified oxide semiconductor layer from which impurities such as hydrogen are sufficiently removed. Specifically, the concentration of hydrogen in the oxide semiconductor layer 140 is $5 \times 10^{19}$ atoms/cm$^3$ or less, preferably $5 \times 10^{18}$ atoms/cm$^3$ or less, far preferably $5 \times 10^{17}$ atmos/cm$^3$ or less. Moreover, the oxide semiconductor layer 140 preferably contains a sufficient amount of oxygen so that defects due to shortage of oxygen are reduced. The oxide semiconductor layer 140 which is highly purified with hydrogen concentration sufficiently reduced has a carrier concentration of less than $1 \times 10^{12}$/cm$^3$, preferably $1 \times 10^{11}$/cm$^3$ or less. The transistor 162 with excellent off-state current characteristics can be obtained with the use of such an oxide semiconductor that becomes intrinsic or substantially intrinsic. For example, when the drain voltage Vd is +1 V or +10 V and the gate voltage Vg is in the range of −5 V to −20 V, the off-state current is $1 \times 10^{-13}$ A or less. The oxide semiconductor layer 140 which is highly purified by a sufficient reduction in hydrogen concentration is used to reduce the off-state current of the transistor 162, whereby a semiconductor device with a novel structure can be realized. Note that the concentration of hydrogen in the oxide semiconductor layer 140 is measured by secondary ion mass spectrometry (SIMS).

An insulating layer 152 is provided over the interlayer insulating layer 146. An electrode 154a, an electrode 154b, an electrode 154c, and an electrode 154d are provided so as to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

That is, in the semiconductor device illustrated in FIGS. 2A and 2B, the gate electrode 110 of the transistor 160 and the source or drain electrode 142a of the transistor 162 are electrically connected through the electrodes 130c, 136c, 150c, 154c, and 150d.

<Method for Manufacturing Semiconductor Device>

Next, an example of a method for manufacturing the semiconductor device will be described. First, a method for manufacturing the transistor 160 in the lower portion is described below with reference to FIGS. 3A to 3H, and then a method for manufacturing the transistor 162 in the upper portion is described with reference to FIGS. 4A to 4G and FIGS. 5A to 5D.

<Method for Manufacturing Lower Transistor>

Figure 3A:
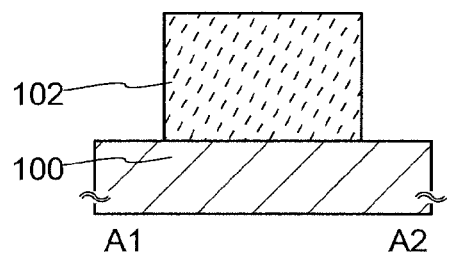
FIGS. 3A to 3H are cross-sectional views illustrating steps for manufacturing a semiconductor device.
Figure 3E:
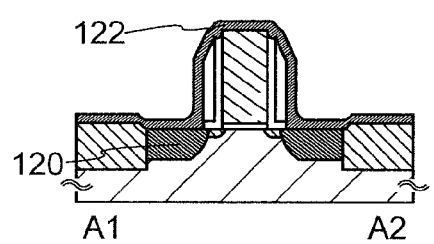

First, the substrate 100 containing a semiconductor material is prepared (see FIG. 3A). As the substrate 100 containing a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. In Embodiment 1, an example of using a single crystal silicon substrate as the substrate 100 containing a semiconductor material is described. In general, the term "SOI substrate" means a substrate where a silicon semiconductor layer is provided on an insulating surface; however, in this specification and the like, the term "SOI substrate" also includes in its category a substrate where a semiconductor layer formed using a material other than silicon is provided over an insulating surface. That is, the semiconductor layer included in the "SOI substrate" is not limited to a silicon semiconductor layer. The "SOI substrate" also includes in its category an insulating substrate such as a glass substrate provided with a semiconductor layer with an insulating layer provided therebetween.

A protective layer 102 serving as a mask for forming an element isolation insulating layer is formed over the substrate 100 (see FIG. 3A). As the protective layer 102, an insulating layer formed using silicon oxide, silicon nitride, silicon nitride oxide, or the like can be used, for example. Before or after this step, an impurity element imparting n-type conductivity or an impurity element imparting p-type conductivity may be added to the substrate 100 in order to control the threshold voltage of the transistor. When the semiconductor material contained in the substrate 100 is silicon, phosphorus, arsenic, or the like can be used as the impurity imparting n-type conductivity; boron, aluminum, gallium, or the like can be used as the impurity imparting p-type conductivity.

Next, part of the substrate 100 in a region that is not covered with the protective layer 102 (i.e., in an exposed region) is removed by etching using the protective layer 102 as a mask. Thus, an isolated semiconductor region 104 is formed (see FIG. 3B). As the etching, dry etching is preferably performed, but wet etching may be performed. An etching gas and an etchant can be selected as appropriate depending on a material of a layer to be etched.

Figure 3B:
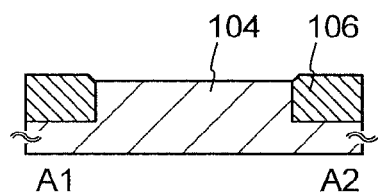
Figure 3F:
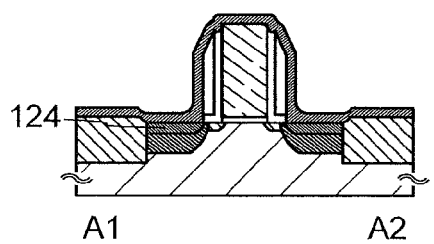

Then, an insulating layer is formed so as to cover the semiconductor region 104, and the insulating layer in a region overlapping with the semiconductor region 104 is selectively removed, so that element isolation insulating layers 106 are formed (see FIG. 3B). The insulating layer is formed using silicon oxide, silicon nitride, silicon nitride oxide, or the like. As a method for removing the insulating layer, any of etching treatment and polishing treatment such as CMP can be employed. The protective layer 102 is removed after the formation of the semiconductor region 104 or after the formation of the element isolation insulating layers 106.

Next, an insulating layer is formed over the semiconductor region 104, and a layer containing a conductive material is formed over the insulating layer.

The insulating layer serves as a gate insulating layer, and preferably has a single-layer structure or a stacked-layer structure using a film containing silicon oxide, silicon nitride oxide, silicon nitride, hafnium oxide, aluminum oxide, tantalum oxide, or the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer; the insulating layer can have a thickness greater than or equal to 1 nm and less than or equal to 100 nm, for example.

The layer containing a conductive material can be formed using a metal material such as aluminum, copper, titanium, tantalum, or tungsten. The layer containing a conductive material may be formed using a semiconductor material such as polycrystalline silicon containing a conductive material. There is no particular limitation on the method for forming the layer containing a conductive material; a variety of film formation methods such as an evaporation method, a CVD method, a sputtering method, or a spin coating method can be employed. Described in Embodiment 1 is an example of the case where the layer containing a conductive material is formed using a metal material.

Figure 3C:
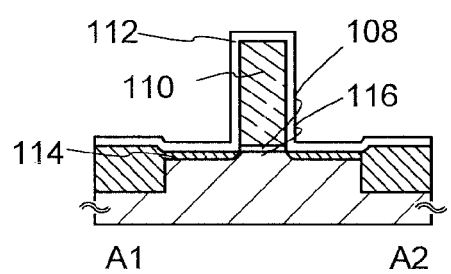

After that, the insulating layer and the layer containing a conductive material are selectively etched, so that the gate insulating layer 108 and the gate electrode 110 are formed (see FIG. 3C).

Next, an insulating layer 112 that covers the gate electrode 110 is formed (see FIG. 3C). Then, phosphorus (P), arsenic (As), or the like is added to the semiconductor region 104, so that the impurity regions 114 with a shallow junction depth are formed in the substrate 100 (see FIG. 3C). Although phosphorus or arsenic is added in Embodiment 1 in order to form an n-channel transistor, another impurity element such as boron (B) or aluminum (Al) may be added in the case of forming a p-channel transistor. With the formation of the impurity regions 114, the channel formation region 116 is formed in the semiconductor region 104 below the gate insulating layer 108 (see FIG. 3C). The concentration of the impurity added is set as appropriate; it is preferable that the concentration be increased when the size of a semiconductor element is extremely decreased, whereby short channel effect can be suppressed. The impurity regions 114 are formed after the formation of the insulating layer 112 in Embodiment 1; alternatively, the insulating layer 112 may be formed after the formation of the impurity regions 114.

Figure 3G:
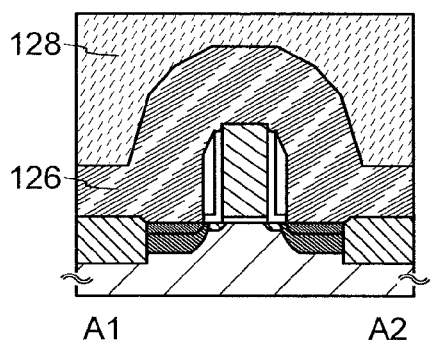
Figure 3D:
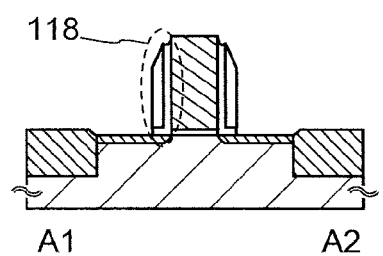

Next, the sidewall insulating layers 118 are formed (see FIG. 3D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110 and top surfaces of the impurity regions 114 are exposed.

Then, an insulating layer is formed so as to cover the gate electrode 110, the impurity regions 114, the sidewall insulating layers 118, and the like. Next, phosphorus (P), arsenic (As), or the like is added to regions where the insulating layer is in contact with the impurity regions 114, so that the high-concentration impurity regions 120 are formed (see FIG. 3E). After that, the insulating layer is removed, and a metal layer 122 is formed so as to cover the gate electrode 110, the sidewall insulating layers 118, the high-concentration impurity regions 120, and the like (see FIG. 3E). A variety of film formation methods such as a vacuum evaporation method, a sputtering method, or a spin coating method can be employed for forming the metal layer 122. It is preferable that the metal layer 122 be formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 3F). When the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, it is preferable to use a method by which heat treatment for an extremely short time can be achieved in order to improve the controllability of chemical reaction in formation of the metal compound. The metal compound regions are formed by reaction of the metal material and the semiconductor material and have sufficiently high conductivity. The metal compound regions can properly reduce the electric resistance and improve element characteristics. The metal layer 122 is removed after the metal compound regions 124 are formed.

Next, the interlayer insulating layer 126 and the interlayer insulating layer 128 are formed so as to cover the components formed through the above steps (see FIG. 3G). The interlayer insulating layers 126 and 128 can be formed using an inorganic insulating material such as silicon oxide, silicon nitride oxide, silicon nitride, hafnium oxide, aluminum oxide, or tantalum oxide. Alternatively, an organic insulating material such as polyimide or acrylic may be used. Although a two-layer structure of the interlayer insulating layer 126 and the interlayer insulating layer 128 is employed in Embodiment 1, the structure of an interlayer insulating layer is not limited to this structure. After the formation of the interlayer insulating layer 128, it is preferable to planarize a surface of the interlayer insulating layer 128 with CMP, etching, or the like.

Figure 3H:
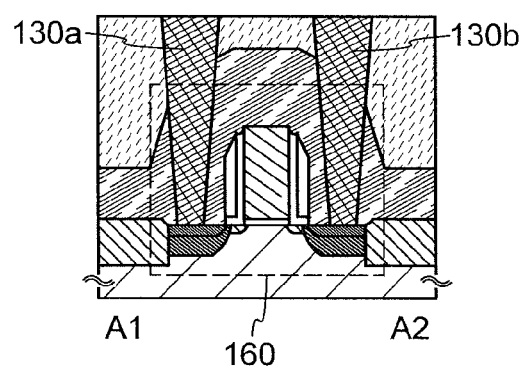

Then, openings that reach the metal compound regions 124 are formed in the interlayer insulating layers, and the source and drain electrodes 130a and 130b are formed in the openings (see FIG. 3H). The source and drain electrodes 130a and 130b can be formed in such a manner, for example, that a conductive layer is formed in a region including the openings by a PVD method, a CVD method, or the like and then part of the conductive layer is removed by etching, CMP, or the like.

In the case where the source and drain electrodes 130a and 130b are formed by removing part of the conductive layer, the process is preferably performed so that the surfaces are planarized. For example, when a thin titanium film or a thin titanium nitride film is formed in a region including the openings and then a tungsten film is formed so as to be embedded in the openings, an unnecessary part of the tungsten film, the titanium film, the titanium nitride film, or the like is removed and the planarity of the surface can be improved by subsequent CMP. By planarizing the surface including the source and drain electrodes 130a and 130b in such a manner, an electrode, a wiring, an insulating layer, a semiconductor layer, and the like can be favorably formed in later steps.

Although only the source and drain electrodes 130a and 130b in contact with the metal compound regions 124 are shown here, an electrode that is in contact with the gate electrode 110 (e.g., the electrode 130c in FIG. 2A) and the like can also be formed in this step. There is no particular limitation on materials used for the source and drain electrodes 130a and 130b; a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 containing a semiconductor material is formed. An electrode, a wiring, an insulating layer, or the like may be further formed after the above steps. When the wiring has a multi-layer structure of a stacked-layer structure including an interlayer insulating layer and a conductive layer, a highly integrated semiconductor device can be provided.

<Method for Manufacturing Upper Transistor>

Next, steps for manufacturing the transistor 162 over the interlayer insulating layer 128 will be described with reference to FIGS. 4A to 4G and FIGS. 5A to 5D. In FIGS. 4A to 4G and FIGS. 5A to 5D, which illustrate steps for manufacturing electrodes, the transistor 162, and the like over the interlayer insulating layer 128, the transistor 160 and the like placed below the transistor 162 are omitted.

Figure 4A:
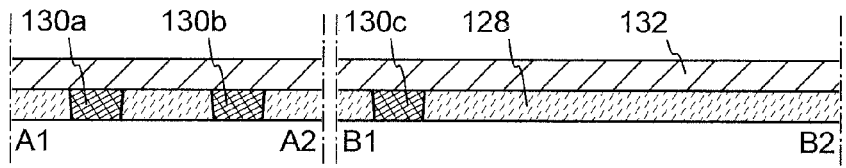
FIGS. 4A to 4G are cross-sectional views illustrating steps for manufacturing a semiconductor device.
Figure 4B:
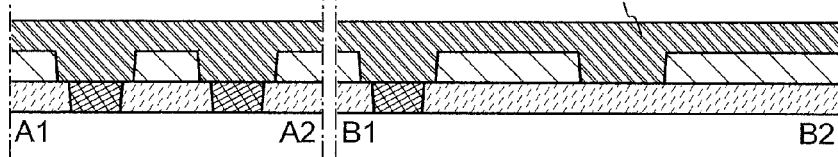

First, the insulating layer 132 is formed over the interlayer insulating layer 128, the source and drain electrodes 130a and 130b, and the electrode 130c (see FIG. 4A). The insulating layer 132 can be formed by a PVD method, a CVD method, or the like. The insulating layer 132 can be formed using an inorganic insulating material such as silicon oxide, silicon nitride oxide, silicon nitride, hafnium oxide, aluminum oxide, or tantalum oxide.

Next, openings that reach the source and drain electrodes 130a and 130b and the electrode 130c are formed in the insulating layer 132. At this time, an opening is also formed in a region where the gate electrode 136d is to be formed later. Then, a conductive layer 134 is formed so as to be embedded in the openings (see FIG. 4B). The openings can be formed by etching using a mask, or the like. The mask can be formed by light exposure using a photomask, or the like. Either wet etching or dry etching may be used as the etching; it is preferable to use dry etching in terms of microfabrication. The conductive layer 134 can be formed by a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. The titanium film formed by a PVD method has a function of reducing an oxide film at the interface with lower electrodes (here, the source and drain electrodes 130a and 130b, the electrode 130c, and the like) to decrease the contact resistance with the lower electrodes. The titanium nitride film formed after the formation of the titanium film has a barrier function of preventing diffusion of the conductive material. A copper film may be formed by a plating method after the formation of the barrier film of titanium, titanium nitride, or the like.

Figure 4C:
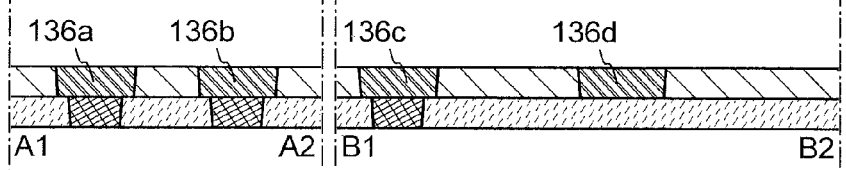

After the conductive layer 134 is formed, part of the conductive layer 134 is removed by etching, CMP, or the like, so that the insulating layer 132 is exposed and the electrodes 136a, 136b, and 136c and the gate electrode 136d are formed (see FIG. 4C). When the electrodes 136a, 136b, and 136c and the gate electrode 136d are formed by removing part of the conductive layer 134, the process is preferably performed so that the surfaces are planarized. By planarizing the surfaces of the insulating layer 132, the electrodes 136a, 136b, and 136c, and the gate electrode 136d in such a manner, an electrode, a wiring, an insulating layer, a semiconductor layer, and the like can be favorably formed in later steps.

Figure 4D:
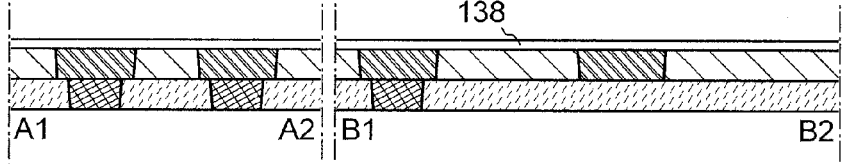

Next, the gate insulating layer 138 is formed so as to cover the insulating layer 132, the electrodes 136a, 136b, and 136c, and the gate electrode 136d (see FIG. 4D). The gate insulating layer 138 can be formed by a CVD method, a sputtering method, or the like. It is preferable that the gate insulating layer 138 contain silicon oxide, silicon nitride, silicon oxynitride, silicon nitride oxide, aluminum oxide, hafnium oxide, tantalum oxide, or the like. Note that the gate insulating layer 138 may have a single-layer structure or a stacked-layer structure. For example, the gate insulating layer 138 can be formed using silicon oxynitride by a plasma CVD method using silane ($SiH_4$), oxygen, and nitrogen as a source gas. There is no particular limitation on the thickness of the gate insulating layer 138; the gate insulating layer 138 can have a thickness greater than or equal to 10 nm and less than or equal to 500 nm, for example. In the case of employing a stacked-layer structure, for example, it is preferable that the gate insulating layer 138 be a stack of a first gate insulating layer having a thickness greater than or equal to 50 nm and less than or equal to 200 nm and a second gate insulating layer with a thickness greater than or equal to 5 nm and less than or equal to of 300 nm over the first gate insulating layer.

An oxide semiconductor that becomes intrinsic or substantially intrinsic by removal of impurities (a highly purified oxide semiconductor) is quite sensitive to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed by a high-density plasma CVD method using a microwave (2.45 GHz) because the gate insulating layer 138 can be dense and have high withstand voltage and high quality. When a highly purified oxide semiconductor layer and a high-quality gate insulating layer are in close contact with each other, the interface level can be reduced and interface characteristics can be favorable.

It is needless to say that, even when a highly purified oxide semiconductor layer is used, another method such as a sputtering method or a plasma CVD method can be employed as long as an insulating layer with high quality can be formed as a gate insulating layer. It is possible to use an insulating layer whose quality and characteristics of the interface with the oxide semiconductor layer are improved with heat treatment performed after the formation of the insulating layer. In any case, an insulating layer that has favorable film quality as the gate insulating layer 138 and can reduce interface level density with an oxide semiconductor layer to form a favorable interface is formed as the gate insulating layer 138.

In a gate bias-temperature stress test (BT test) at 85° C. with $2\times10^6$ V/cm for 12 hours, if an impurity is added to an oxide semiconductor, a bond between the impurity and a main component of the oxide semiconductor is broken by a high electric field (B: bias) and high temperature (T: temperature), and a dangling bond generated causes a drift of the threshold voltage (Vth).

In contrast, impurities of an oxide semiconductor, particularly hydrogen and water, are reduced as much as possible and interface characteristics between the oxide semiconductor and the gate insulating layer are made favorable as described above, whereby a transistor that is stable even through the BT test can be obtained.

Figure 4E:
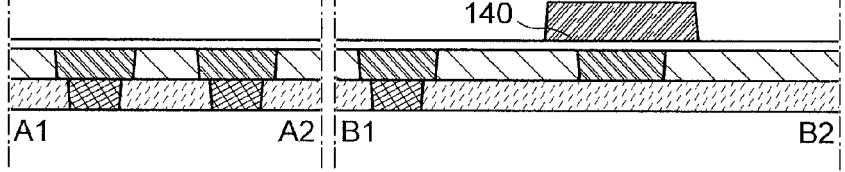

Next, an oxide semiconductor layer is formed over the gate insulating layer 138 and processed by a method such as etching using a mask, so that the island-shaped oxide semiconductor layer 140 is formed (see FIG. 4E).

As the oxide semiconductor layer, an oxide semiconductor layer using any of the followings can be used: a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; or a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; an In—O-based metal oxide, a Sn—O-based metal oxide, or a Zn—O-based metal oxide. $Si_2$ may be contained in the above-described oxide semiconductor layer.

As the oxide semiconductor layer, a thin film expressed by $InMO_3(ZnO)_m$ (m>0) can be used. Here, M represents one or more metal elements selected from Ga, Al, Mn, and Co. For example, Ga, Ga and Al, Ga and Mn, Ga and Co, or the like can be used as M. Among the oxide semiconductor films expressed by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is referred to as an In—Ga—Zn—O-based oxide semiconductor film (In—Ga—Zn—O-based amorphous film) or the like.

In Embodiment 1, as the oxide semiconductor layer, an amorphous oxide semiconductor layer is formed by a sputtering method using a target for depositing an In—Ga—Zn—O-based oxide semiconductor. The addition of silicon to an amorphous oxide semiconductor layer can suppress the crystallization of the layer; therefore, the oxide semiconductor layer may be formed using a target containing $SiO_2$ at 2 to 10 wt. %.

As a target used for forming an oxide semiconductor layer by a sputtering method, a metal oxide target containing zinc oxide as its main component can be used, for example. Moreover, a target for depositing an oxide semiconductor containing In, Ga, and Zn (a composition ratio of $In_2O_3$:$Ga_2O_3$:ZnO=1:1:1 [molar ratio] and In:Ga:Zn=1:1:0.5 [molar ratio]) can be used, for example. Further alternatively, a target for depositing an oxide semiconductor containing In, Ga, and Zn (a composition ratio of $In_2O_3$:$Ga_2O_3$:ZnO=1:1:2 [molar ratio] or a composition ratio of $In_2O_3$:$Ga_2O_3$:ZnO=1:1:4 [molar ratio]) may be used. The filling rate of the target for depositing an oxide semiconductor is greater than or equal to 90% and less than or equal to 100%, preferably greater than or equal to 95% (e.g., 99.9%). A dense oxide semiconductor layer is formed using a target for depositing an oxide semiconductor with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas, for example, from which an impurity such as hydrogen, water, a hydroxyl group, or hydride is removed to a concentration of a few parts per million (preferably a few parts per billion).

In forming the oxide semiconductor layer, the substrate is held in a treatment chamber that is maintained at reduced pressure and the substrate temperature is set to 100° C. to 600° C., preferably 200° C. to 400° C. The oxide semiconductor layer is formed while the substrate is heated, so that the impurity concentration of the oxide semiconductor layer can be reduced. Moreover, damage due to sputtering is reduced. Then, a sputtering gas from which hydrogen and water are removed is introduced into the treatment chamber from which remaining moisture is being removed, and metal oxide is used as a target, so that the oxide semiconductor layer is formed. An entrapment vacuum pump is preferably used in order to remove moisture remaining in the treatment chamber. For example, a cryopump, an ion pump, or a titanium sublimation pump can be used. An evacuation unit may be a turbo pump provided with a cold trap. In the deposition chamber that is evacuated with the cryopump, a hydrogen atom and a compound containing a hydrogen atom such as water ($H_2O$) (and preferably also a compound containing a carbon atom), for example, are removed, whereby the impurity concentration of the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power is 0.5 kW; and the atmosphere is oxygen (the flow rate ratio of oxygen is 100%). It is preferable to use a pulse direct current (DC) power supply because powder substances (also referred to as particles or dust) generated in film deposition can be reduced and the thickness distribution is uniform. The thickness of the oxide semiconductor layer is greater than or equal to 2 nm and less than or equal to 200 nm, preferably greater than or equal to 5 nm and less than or equal to 30 nm. An appropriate thickness differs depending on an oxide semiconductor material; the thickness is set as appropriate depending on the material to be used.

Before the oxide semiconductor layer is formed by a sputtering method, it is preferable that dust on a surface of the gate insulating layer 138 be removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. A nitrogen atmosphere, a helium atmosphere, an oxygen atmosphere, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etching solution, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron chloride ($BCl_3$), silicon chloride ($SiCl_4$), or carbon tetrachloride ($CCl_4$)). Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a predetermined shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, an ammonia peroxide mixture (hydrogen peroxide solution of 31 wt %:ammonia solution of 28 wt %:water=5:2:2), or the like can be used. An etchant such as ITO07N (produced by Kanto Chemical Co., Inc.) may be used as well.

Next, first heat treatment is preferably performed on the oxide semiconductor layer. The oxide semiconductor layer can be dehydrated or dehydrogenated with the first heat treatment. The temperature of the first heat treatment is higher than or equal to 300° C. and lower than or equal to 750° C., preferably higher than or equal to 400° C. and lower than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. During the heat treatment, the oxide semiconductor layer 140 is not exposed to the air so that entry of water and hydrogen can be prevented.

The heat treatment apparatus is not limited to the electric furnace and can be an apparatus for heating an object by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows: the substrate is put in an inert gas having a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

Depending on the conditions of the first heat treatment or the material of the oxide semiconductor layer, the oxide semiconductor layer may be crystallized to be microcrystalline or polycrystalline. For example, the oxide semiconductor layer may become a microcrystalline oxide semiconductor layer having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Further, in the oxide semiconductor layer, a microcrystal (the grain size is greater than or equal to 1 nm and less than or equal to 20 nm, typically greater than or equal to 2 nm and less than or equal to 4 nm) may be mixed in an amorphous oxide semiconductor (e.g., a surface of the oxide semiconductor layer).

The electrical characteristics of the oxide semiconductor layer can be changed by including the microcrystal in the amorphous semiconductor. For example, when the oxide semiconductor layer is formed using a target for depositing an In—Ga—Zn—O-based oxide semiconductor, the electrical characteristics of the oxide semiconductor layer can be changed by formation of a microcrystalline portion in which crystal grains of $In_2Ga_2ZnO_7$ with electrical anisotropy are aligned.

Specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of an impurity such as water or hydrogen into the oxide semiconductor layer.

Note that the oxide semiconductor layer including the microcrystalline portion can be formed by heating the surface of the oxide semiconductor layer by a GRTA process. Further, the oxide semiconductor layer can be formed more preferably by using a sputtering target in which the amount of Zn is smaller than that of In or Ga.

The first heat treatment for the oxide semiconductor layer 140 can be performed on the oxide semiconductor layer before being processed into the island-shaped oxide semiconductor layer 140. In that case, after the first heat treatment, the substrate is taken out of the heating apparatus and a photolithography step is performed.

Note that the first heat treatment can be referred to as dehydration treatment, dehydrogenation treatment, or the like because of its effect of dehydration or dehydrogenation on the oxide semiconductor layer 140. Such dehydration treatment or dehydrogenation treatment can be performed, for example, after the oxide semiconductor layer is formed, after a source electrode and a drain electrode are stacked over the oxide semiconductor layer 140, or after a protective insulating layer is formed over the source and drain electrodes. Such dehydration treatment or dehydrogenation treatment may be performed plural times.

Figure 4F:
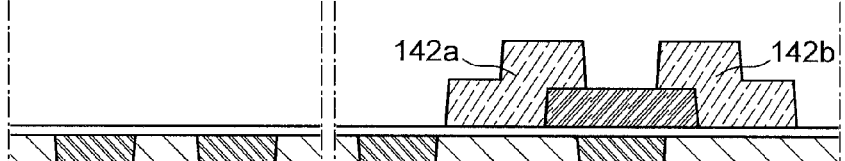

Next, the source or drain electrode 142*a* and the source or drain electrode 142*b* are formed in contact with the oxide semiconductor layer 140 (see FIG. 4F). The source and drain electrodes 142*a* and 142*b* can be formed in such a manner that a conductive layer is formed so as to cover the oxide semiconductor layer 140 and then is selectively etched.

The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. One or more materials selected from manganese, magnesium, zirconium, beryllium, or thorium may be used. Aluminum combined with one or more of elements selected from titanium, tantalum, tungsten, molybdenum, chromium, neodymium, or scandium may be used.

The conductive layer may be formed using conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, sometimes referred to as ITO), an alloy of indium oxide and zinc oxide ($In_2O_3$—ZnO), and such a metal oxide material containing silicon or silicon oxide.

The conductive layer can have a single-layer structure or a stacked-layer structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

Here, ultraviolet light, KrF laser light, or ArF laser light is preferably used for light exposure in forming a mask used for etching.

The channel length (L) of the transistor is determined by a distance between a lower edge portion of the source or drain electrode 142*a* and a lower edge portion of the source or drain electrode 142*b*. For the light exposure in the case where the channel length (L) is less than 25 nm, light exposure for forming a mask is performed with extreme ultraviolet rays whose wavelength is several nanometers to several hundreds of nanometers, which is extremely short. The resolution of light exposure with extreme ultraviolet rays is high and the depth of focus is large. For these reasons, the channel length (L) of the transistor to be formed later can be greater than or equal to 10 nm and less than or equal to 1000 nm, and the circuit can operate at higher speed. Moreover, the off-state current is extremely low, which prevents power consumption from increasing.

Materials and etching conditions of the conductive layer and the oxide semiconductor layer 140 are adjusted as appropriate so that the oxide semiconductor layer 140 is not removed in etching of the conductive layer. The oxide semiconductor layer 140 may be partly etched in the etching step and thus has a groove portion (a recessed portion) depending on the materials and the etching conditions.

An oxide conductive layer may be formed between the oxide semiconductor layer 140 and the source or drain electrode 142*a* and/or between the oxide semiconductor layer 140 and the source or drain electrode 142*b*. The oxide conductive layer and a metal layer for forming the source and drain electrodes 142*a* and 142*b* can be successively formed (successive film deposition). The oxide conductive layer can function as a source region or a drain region. Such an oxide conductive layer can reduce the resistance of the source region or the drain region, so that the transistor can operate at high speed.

In order to reduce the number of masks to be used or the number of steps, an etching step may be performed with the use of a resist mask formed using a multi-tone mask which is a light-exposure mask through which light is transmitted to have a plurality of intensities. The resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

It is preferable to perform plasma treatment with the use of a gas such as $N_2O$, $N_2$, or Ar after the above-described step. This plasma treatment removes water or the like attached on an exposed surface of the oxide semiconductor layer. Plasma treatment using a mixed gas of oxygen and argon may be performed.

Figure 4G:
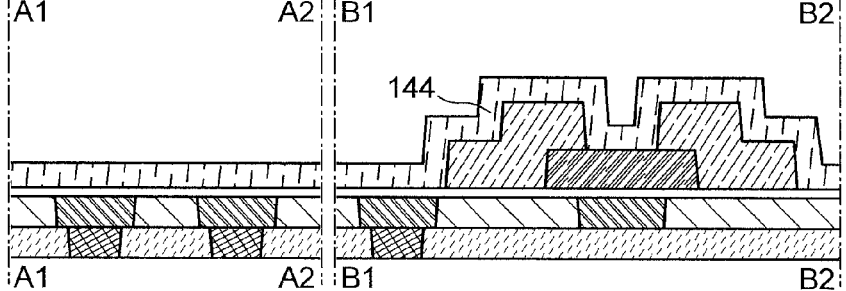

Next, the protective insulating layer 144 is formed in contact with part of the oxide semiconductor layer 140 without exposure to the air (see FIG. 4G).

The protective insulating layer 144 can be formed by a method by which impurities such as water and hydrogen are prevented from being mixed to the protective insulating layer 144, such as a sputtering method, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a stacked-layer structure. The substrate temperature in forming the protective insulating layer 144 is preferably higher than or equal to room temperature and lower than or equal to 300° C. The atmosphere for forming the protective insulating layer 144 is preferably a rare gas (typically argon) atmosphere, an oxygen atmosphere, or a mixed atmosphere containing a rare gas (typically argon) and oxygen.

Hydrogen contained in the protective insulating layer 144 causes entry of the hydrogen into the oxide semiconductor layer or extraction of oxygen in the oxide semiconductor layer, whereby the resistance of the oxide semiconductor layer on the backchannel side might be decreased and a parasitic channel might be formed. Therefore, it is important not to use hydrogen in forming the protective insulating layer 144 so that the oxide insulating layer 144 contains hydrogen as little as possible.

Moreover, the protective insulating layer 144 is preferably formed while water remaining in the treatment chamber is removed, in order that hydrogen, a hydroxyl group, or water is not contained in the oxide semiconductor layer 140 and the protective insulating layer 144.

An entrapment vacuum pump is preferably used in order to remove moisture remaining in the treatment chamber. For example, a cryopump, an ion pump, or a titanium sublimation pump is preferably used. An evacuation unit may be a turbo pump provided with a cold trap. In the deposition chamber that is evacuated with the cryopump, a hydrogen atom and a compound containing a hydrogen atom, such as water ($H_2O$), are removed, for example; thus, the impurity concentration of the protective insulating layer 144 formed in the deposition chamber can be reduced.

As a sputtering gas used for forming the protective insulating layer 144, it is preferable to use a high-purity gas from which an impurity such as hydrogen, water, a hydroxyl group, or hydride is removed to a concentration of a few parts per million (preferably a few parts per billion).

Next, second heat treatment is preferably performed in an inert gas atmosphere or an oxygen gas atmosphere (preferably at 200° C. to 400° C., for example, at 250° C. to 350° C.). For example, the second heat treatment is performed at 250° C. for one hour in a nitrogen atmosphere. The second heat treatment can reduce variation in electric characteristics of the transistor.

Further, heat treatment may be performed at 100° C. to 200° C. for one hour to 30 hours in the air. This heat treatment may be performed at a fixed heating temperature; alternatively, the following change in the heating temperature may be conducted plural times repeatedly: the heating temperature is increased from room temperature to a temperature higher than or equal to 100° C. lower than or equal to 200° C. and then decreased to room temperature. This heat treatment may be performed under a reduced pressure before the protective insulating layer is formed. The heat treatment time can be shortened under the reduced pressure. This heat treatment may be performed instead of the second heat treatment or may be performed before or after the second heat treatment, for example.

Figure 5A:
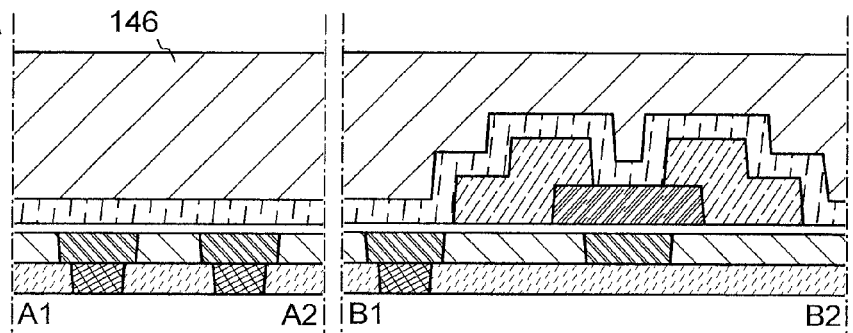
FIGS. 5A to 5D are cross-sectional views illustrating steps for manufacturing a semiconductor device.
Figure 5B:
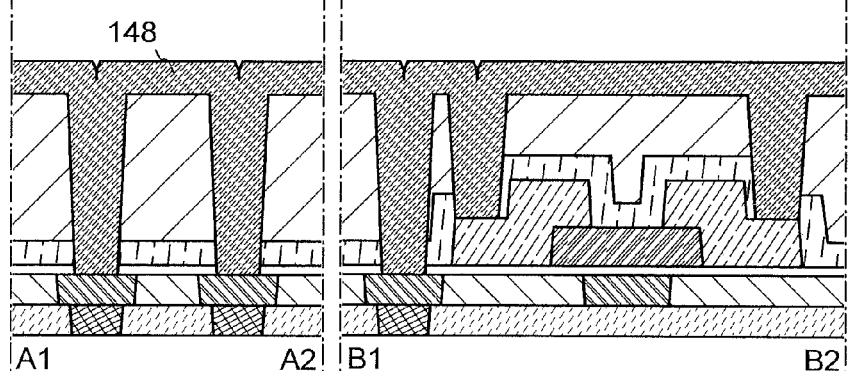

Next, the interlayer insulating layer 146 is formed over the protective insulating layer 144 (see FIG. 5A). The interlayer insulating layer 146 can be formed by a PVD method, a CVD method, or the like. The interlayer insulating layer 146 can be formed using an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrodes 136a, 136b, and 136c and the source and drain electrodes 142a and 142b are formed in the interlayer insulating layer 146, the protective insulating layer 144, and the gate insulating layer 138. Then, a conductive layer 148 is formed so as to be embedded in the openings (see FIG. 5B). The openings can be formed by a method such as etching using a mask. The mask can be formed by a method such as light exposure using a photomask. Either wet etching or dry etching may be used as the etching; dry etching is preferable in terms of microfabrication. The conductive layer 148 can be formed by a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film at the interface with lower electrodes (here, the electrodes 136a, 136b, and 136c and the source and drain electrodes 142a and 142b) to decrease the contact resistance with the lower electrodes. The titanium nitride film formed after the formation of the titanium film has a barrier function of preventing diffusion of the conductive material. A copper film may be formed by a plating method after the formation of the barrier film of titanium, titanium nitride, or the like.

Figure 5C:
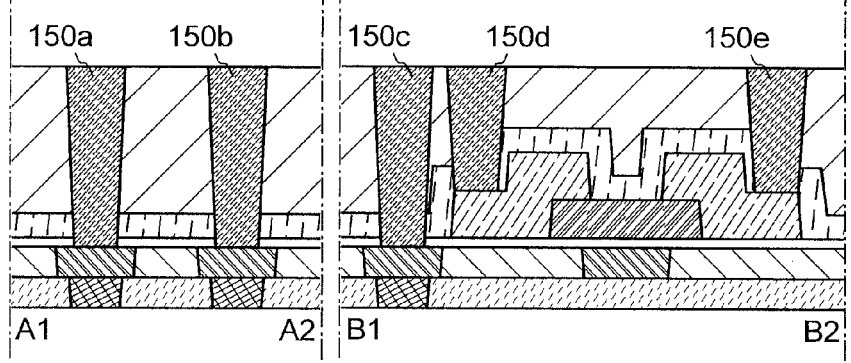
Figure 5D:
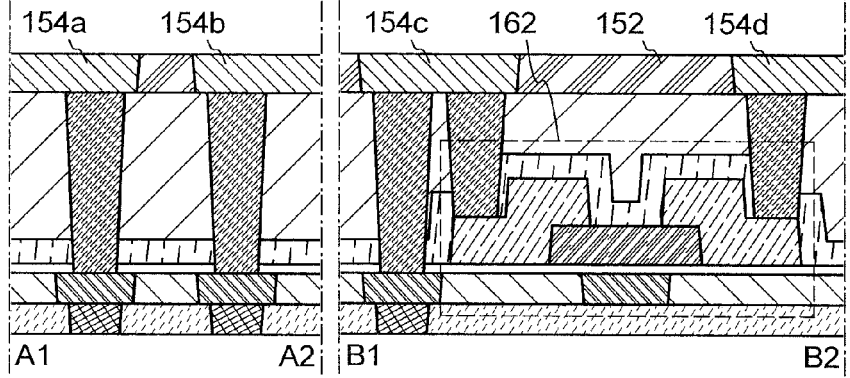

After the conductive layer 148 is formed, part of the conductive layer 148 is removed by etching, CMP, or the like, so that the interlayer insulating layer 146 is exposed and the electrodes 150a, 150b, 150c, 150d, and 150e are formed (see FIG. 5C). Note that when the electrodes 150a, 150b, 150c, 150d, and 150e are formed by removing part of the conductive layer 148, the process is preferably performed so that the surfaces are planarized. The surfaces of the interlayer insulating layer 146 and the electrodes 150a, 150b, 150c, 150d, and 150e are planarized in such a manner, whereby an electrode, a wiring, an insulating layer, a semiconductor layer, and the like can be favorably formed in later steps.

Then, the insulating layer 152 is formed, and openings that reach the electrodes 150a, 150b, 150c, 150d, and 150e are formed in the insulating layer 152. After a conductive layer is formed so as to be embedded in the openings, part of the conductive layer is removed by etching, CMP, or the like. Thus, the insulating layer 152 is exposed and the electrodes 154a, 154b, 154c, and 154d are formed (see FIG. 5D). This step is similar to the step of forming the electrode 150a and the like; therefore, the detailed description thereof is not repeated.

In the case where the transistor 162 is formed by the above-described method, the hydrogen concentration of the oxide semiconductor layer 140 is $5 \times 10^{19}$ atmos/cm$^3$ or less and the off-state current of the transistor 162 is $1 \times 10^{-13}$ A or less. The transistor 162 with excellent characteristics can be obtained by the application of the oxide semiconductor layer 140 that is highly purified by a sufficient reduction in hydrogen concentration. Moreover, it is possible to manufacture a semiconductor device that has excellent characteristics and includes the transistor 160 formed using a material other than an oxide semiconductor in the lower portion and the transistor 162 formed using an oxide semiconductor in the upper portion.

Note that silicon carbide (e.g., 4H-SiC) is a semiconductor material that can be compared to an oxide semiconductor. An oxide semiconductor and 4H-SiC have some points in common. One example is carrier density. The density of intrinsic carriers in an oxide semiconductor at room temperature is estimated to be about $10^{-7}$/cm$^3$; this value is extremely small similarly to that in 4H-SiC, $6.7 \times 10^{-11}$/cm$^3$. When the minority carrier density of the oxide semiconductor is compared with the intrinsic carrier density of silicon (about $1.4 \times 10^{10}$/cm$^3$), it is easy to understand that intrinsic carrier density of the oxide semiconductor is significantly low.

In addition, the energy band gap of the oxide semiconductor is 3.0 eV to 3.5 eV and that of 4H-SiC is 3.26 eV, which means that both the oxide semiconductor and silicon carbide are wide bandgap semiconductors.

On the other hand, there is a major difference between the oxide semiconductor and silicon carbide; the process temperature. For example, heat treatment for dopant activation at 1500° C. to 2000° C. is needed in a semiconductor process using silicon carbide, so that it is difficult to form a stack of silicon carbide and a semiconductor element formed using a semiconductor material other than silicon carbide. This is because a semiconductor substrate, a semiconductor element, and the like are damaged by such high temperature. To the contrary, the oxide semiconductor can be formed with heat treatment at 300° C. to 500° C. (at a temperature equal to or lower than the glass transition temperature, about 700° C. at the maximum); therefore, a semiconductor element can be formed using an oxide semiconductor after an integrated circuit is formed using another semiconductor material.

The oxide semiconductor has an advantage over silicon carbide in that a low heat-resistant substrate such as a glass substrate can be used. Moreover, the oxide semiconductor also has an advantage in that energy costs can be sufficiently reduced as compared to silicon carbide because heat temperature at high temperature is not necessary.

Although many researches on properties of an oxide semiconductor have been conducted, they do not include the idea of sufficiently reducing a localized level itself in an energy gap. According to one embodiment of the present invention, a highly-purified oxide semiconductor is formed by removing water or hydrogen that can be a cause of a localized level. This is based on the idea that a localized level itself in an energy gap is sufficiently reduced. Thus, excellent industrial products can be manufactured.

Oxygen may be removed at the same time of removal of hydrogen or water. In view of the above, a more highly-purified (i-type) oxide semiconductor by supplying oxygen to a dangling bond of metal which is generated by oxygen vacancy and reducing a localized level due to the oxygen vacancy, a more highly-purified (i-type) oxide semiconductor can be formed. For example, an oxygen-excessive oxide film may be formed in close contact with the channel formation region and heat treatment at 200° C. to 400° C., typically about 250° C. may be performed, whereby oxygen can be supplied from the oxide film to decrease a localized level by oxygen vacancy.

The second heat treatment may be followed by a step of decreasing the temperature in an oxygen atmosphere or an atmosphere from which hydrogen or water is sufficiently removed, whereby oxygen can be supplied to the oxide semiconductor.

Donors in an oxide semiconductor is said to be attributed to a shallow level of 0.1 eV to 0.2 eV under the conduction band due to excessive hydrogen, a deep level due to shortage of oxygen, or the like. The technical idea that hydrogen is reduced as much as possible and oxygen is adequately supplied in order to eliminate such a defect would be right.

An oxide semiconductor is generally considered as an n-type semiconductor; however, according to one embodiment of the present invention, an i-type semiconductor is realized by removing impurities, particularly water or hydrogen. In this point, it can be said that one embodiment of the present invention includes a novel technical idea because it is different from an i-type semiconductor using silicon formed by adding an impurity.

<Electrical Conduction Mechanism of Transistor Including Oxide Semiconductor>

An electrical conduction mechanism of a transistor including an oxide semiconductor will be described with reference to FIG. 6, FIG. 7, FIGS. 8A and 8B, and FIG. 9. Note that the following description is based on the assumption of an ideal situation for easy understanding and does not necessarily reflect a real situation. Note also that the following description is just a consideration and does not affect the validity of the invention.

Figure 6:
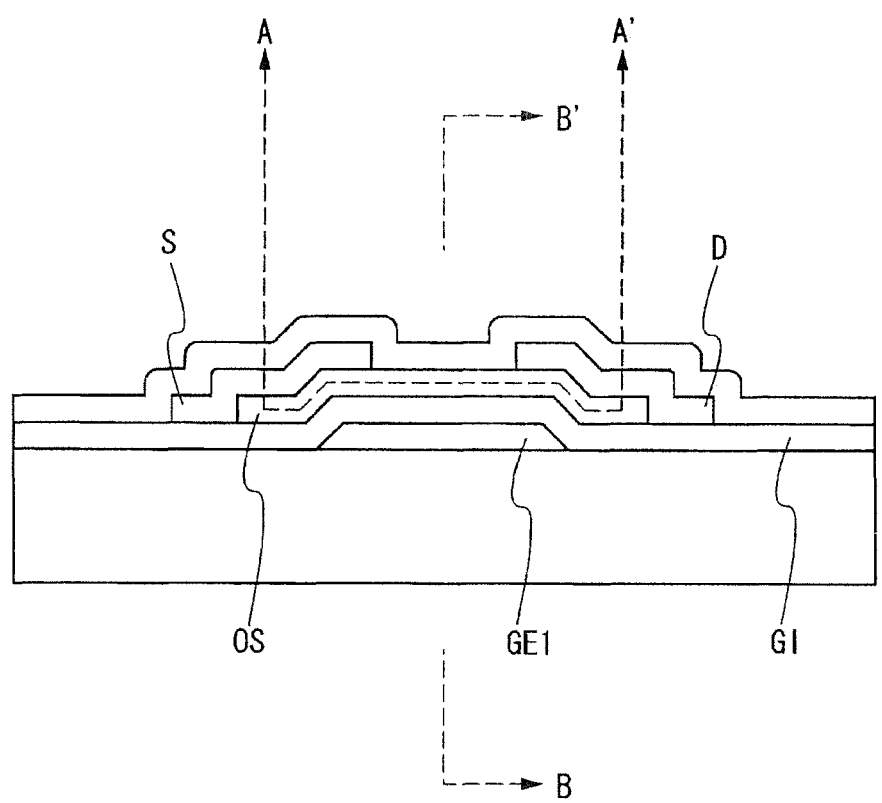
FIG. 6 is a cross-sectional view of a transistor including an oxide semiconductor.

FIG. 6 is a cross-sectional view of a transistor (thin film transistor) including an oxide semiconductor. An oxide semiconductor layer (OS) is provided over a gate electrode (GE1) with a gate insulating layer (GI) interposed therebetween, and a source electrode (S) and a drain electrode (D) are provided thereover. An insulating layer is provided so as to cover the source electrode (S) and the drain electrode (D).

Figure 7:
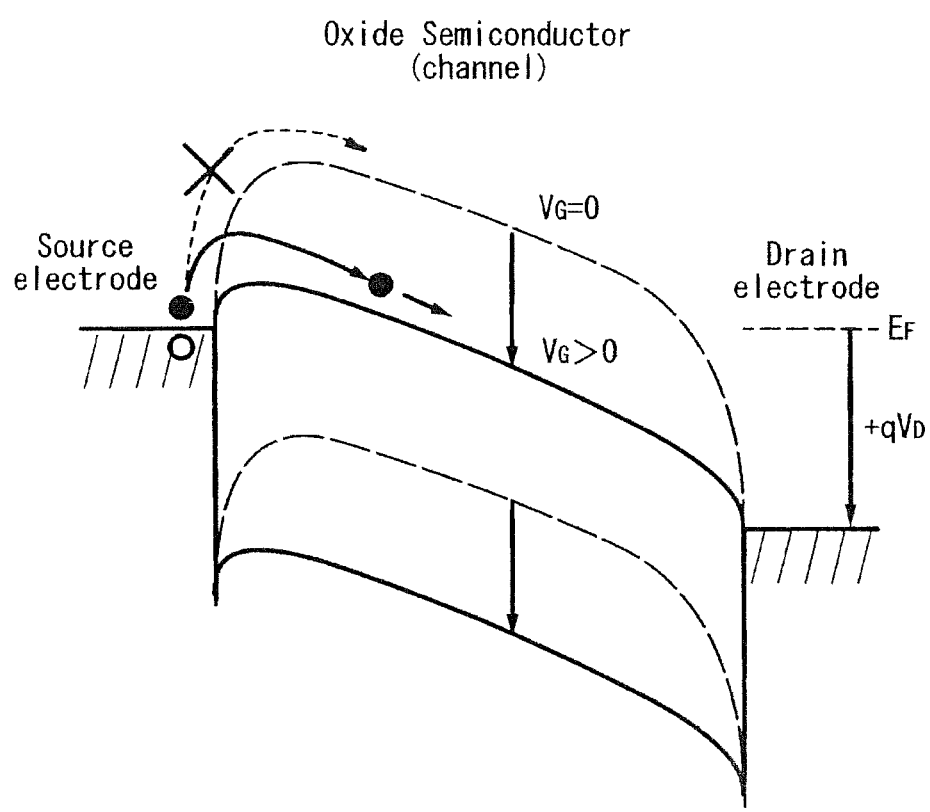
FIG. 7 is an energy band diagram (schematic diagram) along an A-A' section in FIG. 6.

FIG. 7 is an energy band diagram (schematic diagram) of the A-A' section in FIG. 6. In FIG. 7, a black circle (●) and a white circle (○) represent an electron and a hole and have electric charges (−q, +q), respectively. With a positive voltage ($V_D$>0) applied to the drain electrode, the dashed line shows the case where no voltage is applied to the gate electrode ($V_G$=0) and the solid line shows the case where a positive voltage is applied to the gate electrode ($V_G$>0). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 8A:
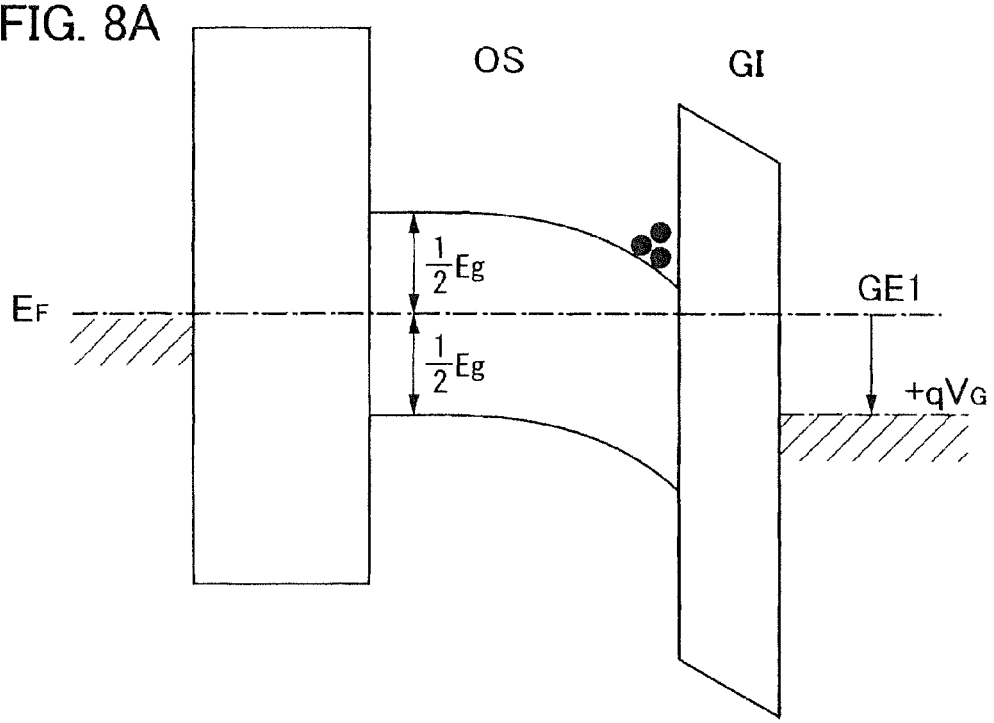
FIG. 8A is a diagram illustrating a state where a positive voltage ($V_G>0$) is applied to a gate (GE1) and FIG. 8B is a diagram illustrating a state where a negative voltage ($V_G<0$) is applied to the gate (GE1).
Figure 8B:
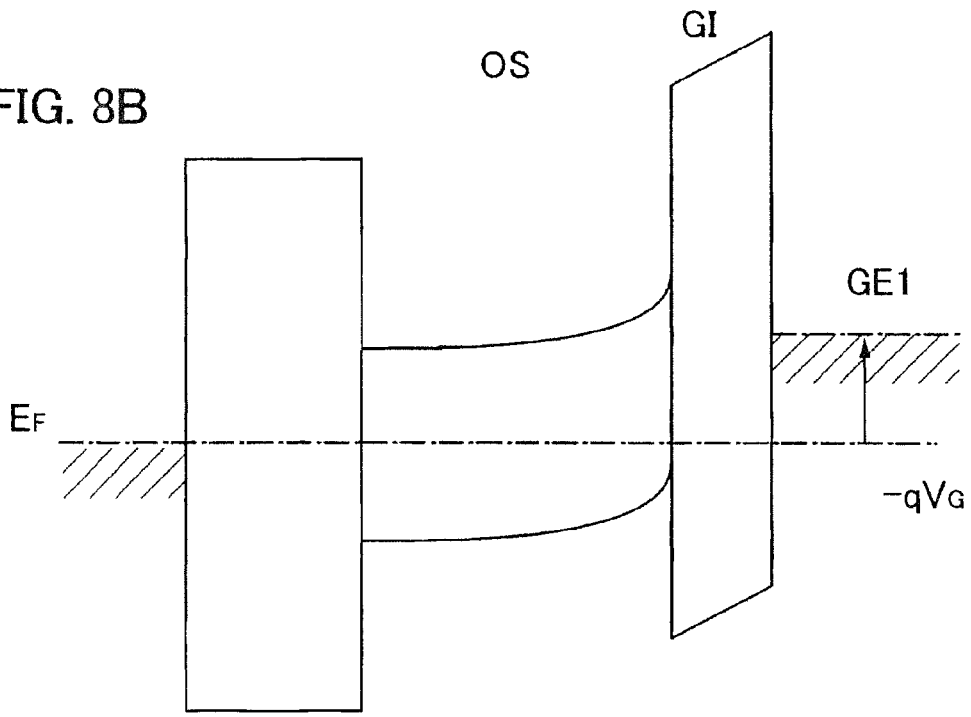

FIGS. 8A and 8B are energy band diagrams (schematic diagrams) of the B-B' section in FIG. 6. FIG. 8A illustrates an on state in which a positive voltage ($V_G>0$) is applied to the gate electrode (GE1) and carriers (electrons) flow between the source electrode and the drain electrode. FIG. 8B illustrates an off state in which a negative voltage ($V_G<0$) is applied to the gate electrode (GE1) and minority carriers do not flow.

Figure 9:
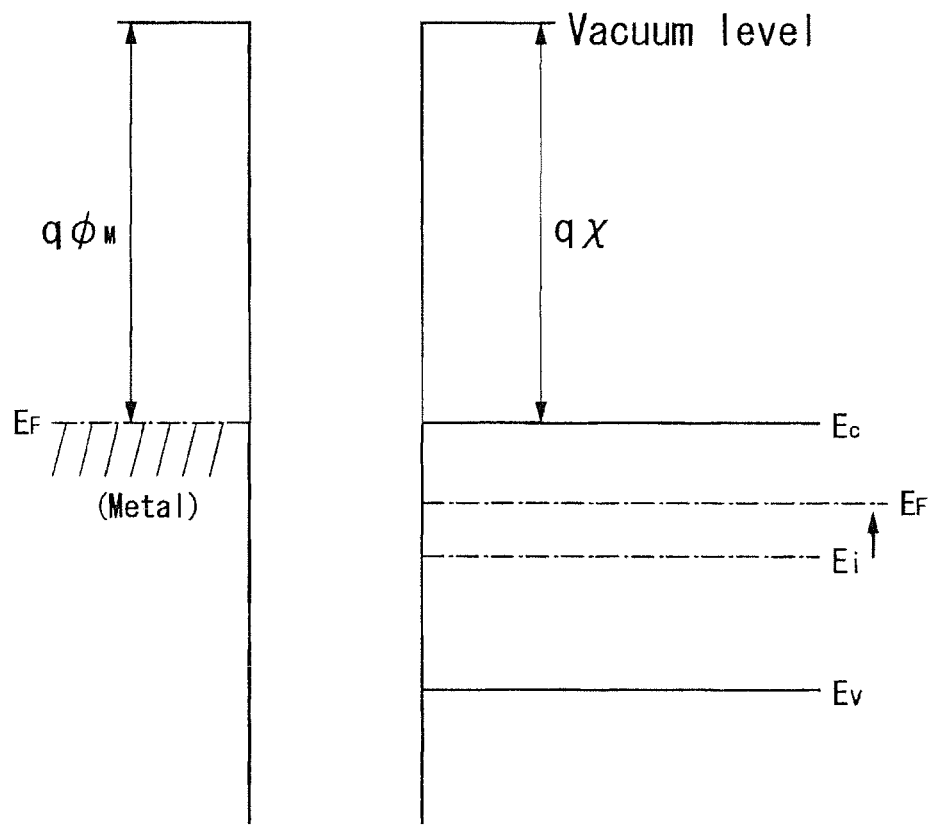
FIG. 9 is a diagram illustrating the relationships between the vacuum level and the work function of a metal ($\varphi_M$) and between the vacuum level and the electron affinity ($\chi$) of an oxide semiconductor.

FIG. 9 illustrates the relationships between the vacuum level and the work function of a metal ($\varphi_m$) and between the vacuum level and the electron affinity ($\chi$) of an oxide semiconductor.

At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to one embodiment of the disclosed invention is an intrinsic (i-type) or a substantially intrinsic oxide semiconductor which is obtained by removing hydrogen that is a factor for an n-type semiconductor from an oxide semiconductor and purifying the oxide semiconductor such that an element other than a main component of the oxide semiconductor (i.e., an impurity element) is prevented from being contained therein as much as possible. In other words, a feature is that a purified i-type (intrinsic) semiconductor, or a semiconductor close thereto, is obtained not by adding an impurity element but by removing an impurity such as hydrogen or water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

At that time, the electron moves in the vicinity of the interface between the gate insulating layer and the purified oxide semiconductor (the lowest portion of the oxide semiconductor which is stable in terms of energy) as illustrated in FIG. 8A.

In addition, as illustrated in FIG. 8B, when a negative potential is applied to the gate electrode (GE1), the value of current is extremely close to zero because holes that are minority carriers are substantially zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is purified and the interface between the oxide semiconductor and the gate insulating layer is made favorable, in the case where the transistor has a channel width (W) of $1\times10^4$ μm and a channel length (L) of 3 μm, for example, it is possible to realize an off-state current of $10^{-13}$ A or less and a subthreshold swing (S value) of 0.1 V/dec (with a 100-nm-thick gate insulating layer).

The oxide semiconductor is purified as described above so as to contain an element other than its main element (i.e., an impurity element) as little as possible, so that the thin film transistor can operate in a favorable manner.

Modification Example

FIG. 10, FIGS. 11A and 11B, FIGS. 12A and 12B, and FIGS. 13A and 13B illustrate modification examples of a structure of a semiconductor device. The semiconductor devices in each of which the transistor 162 has a structure different from that described above will be described below as modification examples. That is, the structure of the transistor 160 is the same as the above.

Figure 10:
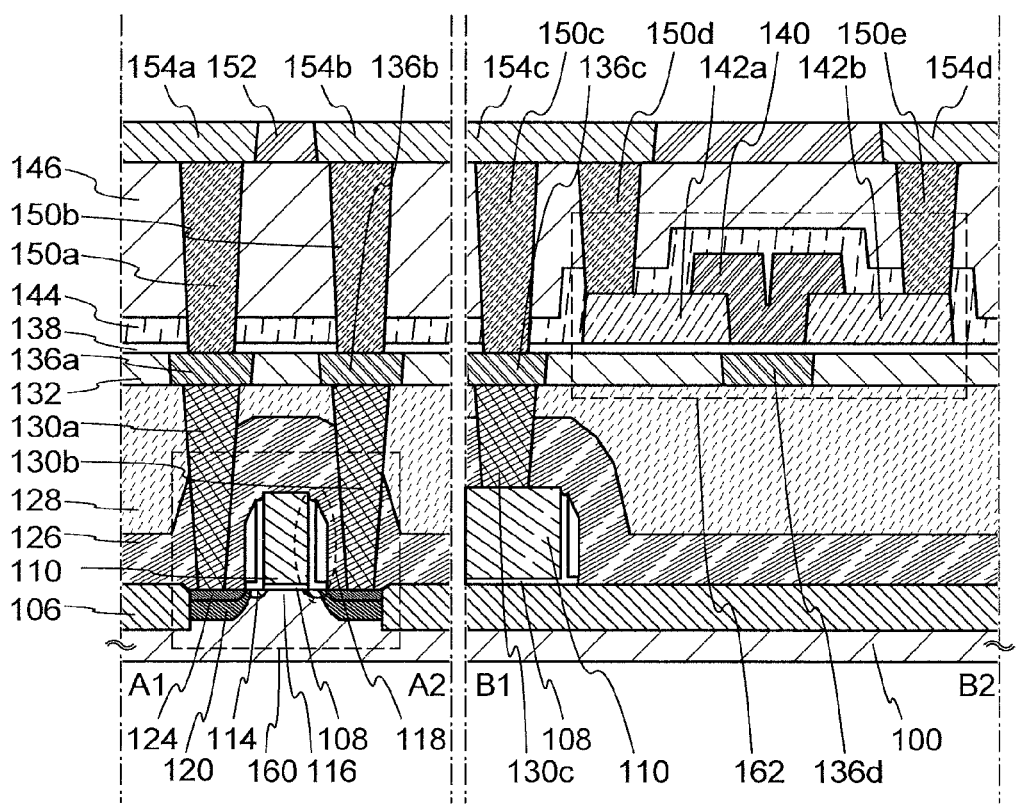
FIG. 10 is a cross-sectional view illustrating a semiconductor device.

FIG. 10 illustrates an example of a semiconductor device including the transistor 162 in which the gate electrode 136d is placed below the oxide semiconductor layer 140 and the source and drain electrodes 142a and 142b are in contact with a bottom surface of the oxide semiconductor layer 140. Note that the planar structure can be changed as appropriate to correspond to the cross section; therefore, only the cross section is shown here.

A big difference between the structure in FIG. 10 and the structure in FIG. 2A is the position at which the oxide semiconductor layer 140 is connected to the source or drain electrode 142a or 142b. That is, a top surface of the oxide semiconductor layer 140 is in contact with the source and drain electrodes 142a and 142b in the structure in FIG. 2A, whereas the bottom surface of the oxide semiconductor layer 140 is in contact with the source and drain electrodes 142a and 142b in the structure in FIG. 10. Moreover, the difference in the contact position results in a different arrangement of other electrodes, an insulating layer, and the like. The details of each component are the same as those of FIGS. 2A and 2B.

Specifically, the semiconductor device includes the gate electrode 136d provided over the interlayer insulating layer 128, the gate insulating layer 138 provided over the gate electrode 136d, the source and drain electrodes 142a and 142b provided over the gate insulating layer 138, and the oxide semiconductor layer 140 in contact with top surfaces of the source and drain electrodes 142a and 142b.

The gate electrode 136d is provided so as to be embedded in the insulating layer 132 formed over the interlayer insulating layer 128. Like the gate electrode 136d, the electrode 136a, the electrode 136b, and the electrode 136c are formed in contact with the source or drain electrode 130a, the source or drain electrode 130b, and the electrode 130c, respectively.

The protective insulating layer 144 is provided over the transistor 162 so as to be in contact with part of the oxide semiconductor layer 140. The interlayer insulating layer 146 is provided over the protective insulating layer 144. Openings that reach the source and drain electrode 142a and 142b are formed in the protective insulating layer 144 and the interlayer insulating layer 146. The electrode 150d and the electrode 150e are formed in contact with the source or drain electrode 142a and the source or drain electrode 142b, respectively, through the respective openings. Like the electrodes 150d and 150e, the electrodes 150a, 150b, and 150c are formed in contact with the electrodes 136a, 136b, and 136c, respectively, through openings provided in the gate insulating layer 138, the protective insulating layer 144, and the interlayer insulating layer 146.

The insulating layer 152 is provided over the interlayer insulating layer 146. The electrodes 154a, 154b, 154c, and 154*d* are provided so as to be embedded in the insulating layer 152. The electrode 154*a* is in contact with the electrode 150*a*. The electrode 154*b* is in contact with the electrode 150*b*. The electrode 154*c* is in contact with the electrode 150*c* and the electrode 150*d*. The electrode 154*d* is in contact with the electrode 150*e*.

Figure 11A:
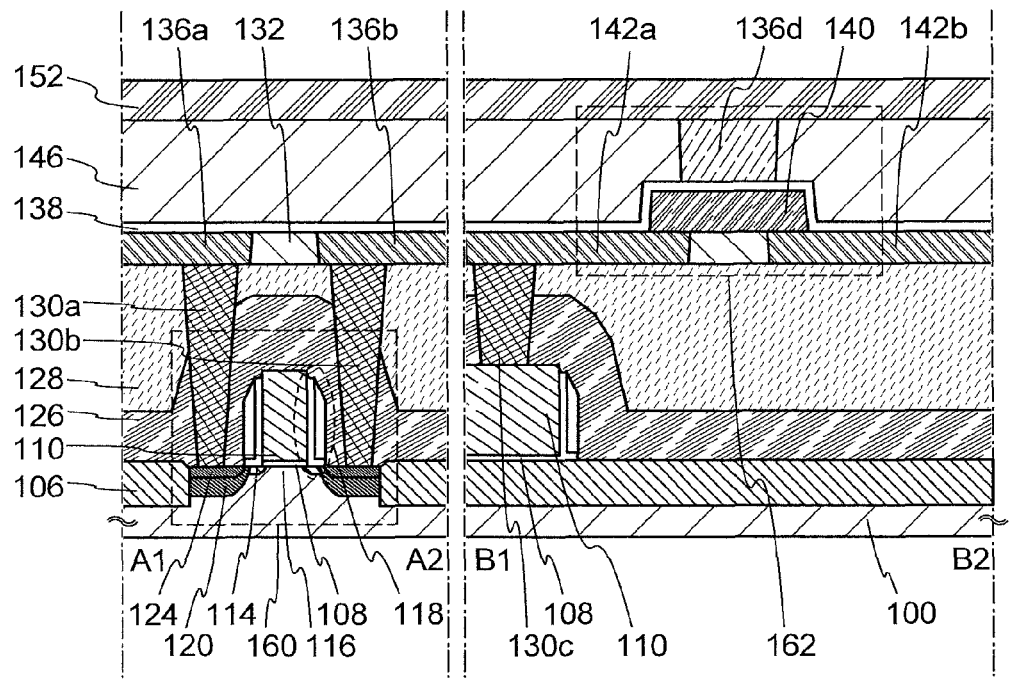
FIGS. 11A and 11B are cross-sectional views each illustrating a semiconductor device.
Figure 11B:
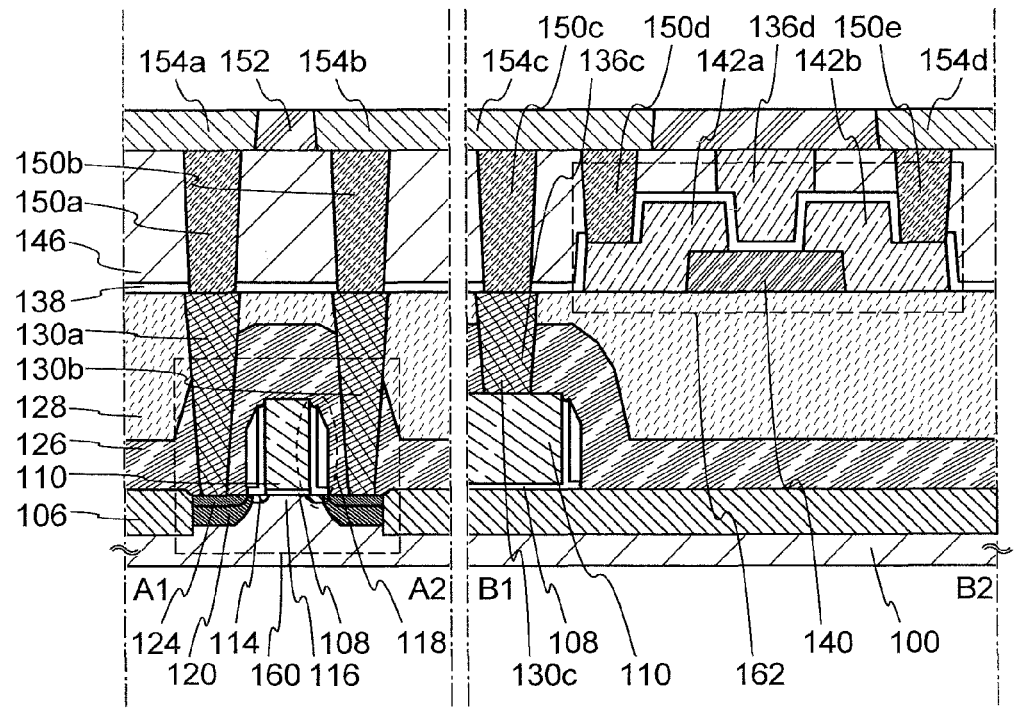

FIGS. 11A and 11B each illustrate an example of a structure in which the gate electrode 136*d* is placed over the oxide semiconductor layer 140. FIG. 11A illustrates an example of a structure in which the source and drain electrodes 142*a* and 142*b* are in contact with a bottom surface of the oxide semiconductor layer 140. FIG. 11B illustrates an example of a structure in which the source and drain electrodes 142*a* and 142*b* are in contact with a top surface of the oxide semiconductor layer 140.

A big difference between the structures in FIGS. 11A and 11B and those in FIG. 2A and FIG. 10 is that the gate electrode 136*d* is placed over the oxide semiconductor layer 140. Furthermore, a big difference between the structure in FIG. 11A and the structure in FIG. 11B is that which of the bottom surface or the top surface of the oxide semiconductor layer 140 the source and drain electrodes 142*a* and 142*b* are in contact with. Moreover, these differences result in a different arrangement of other electrodes, an insulating layer, and the like. The details of each component are the same as those of FIGS. 2A and 2B, and the like.

Specifically, the semiconductor device illustrated in FIG. 11A includes the source and drain electrodes 142*a* and 142*b* provided over the interlayer insulating layer 128, the oxide semiconductor layer 140 in contact with top surfaces of the source and drain electrodes 142*a* and 142*b*, the gate insulating layer 138 provided over the oxide semiconductor layer 140, and the gate electrode 136*d* over the gate insulating layer 138 in a region overlapping with the oxide semiconductor layer 140.

The semiconductor device in FIG. 11B includes the oxide semiconductor layer 140 provided over the interlayer insulating layer 128, the source and drain electrodes 142*a* and 142*b* provided to be in contact with a top surface of the oxide semiconductor layer 140, the gate insulating layer 138 provided over the oxide semiconductor layer 140 and the source and drain electrodes 142*a* and 142*b*, and the gate electrode 136*d* over the gate insulating layer 138 in a region overlapping with the oxide semiconductor layer 140.

Note that in the structures in FIGS. 11A and 11B, a component (e.g., the electrode 150*a* or the electrode 154*a*) can be sometimes omitted from the structure in FIGS. 2A and 2B or the like. In that case, a secondary effect such as simplification of a manufacturing process can be obtained. It is needless to say that a nonessential component can be omitted in the structures in FIGS. 2A and 2B and the like.

Figure 12A:
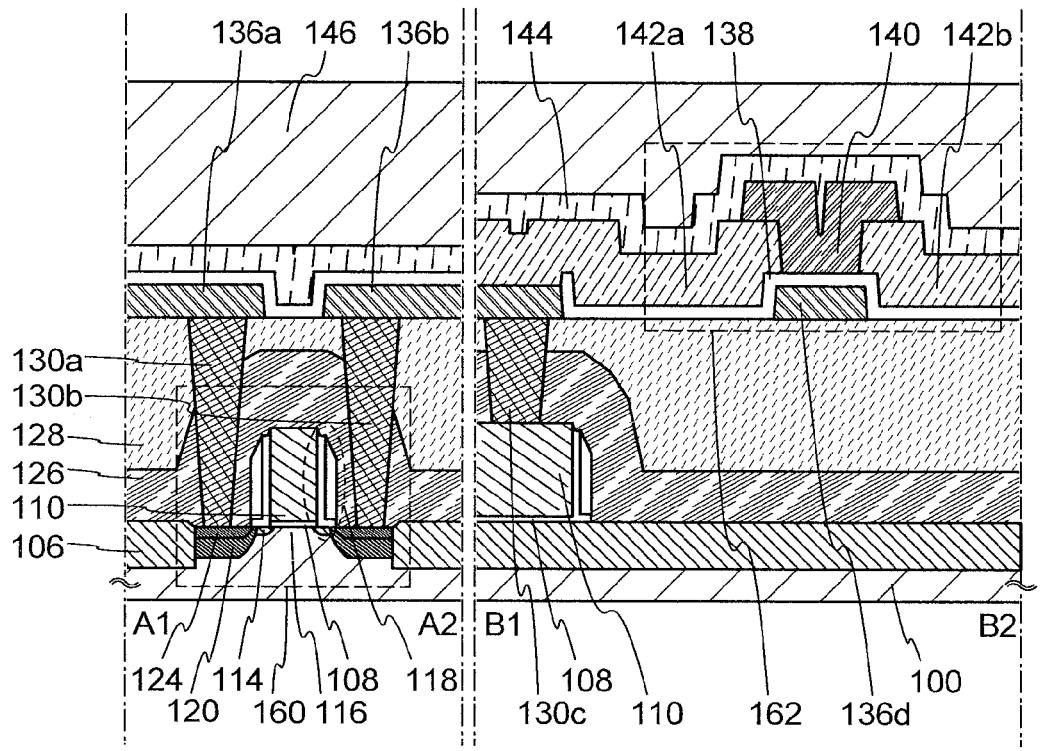
FIGS. 12A and 12B are cross-sectional views each illustrating a semiconductor device.
Figure 12B:
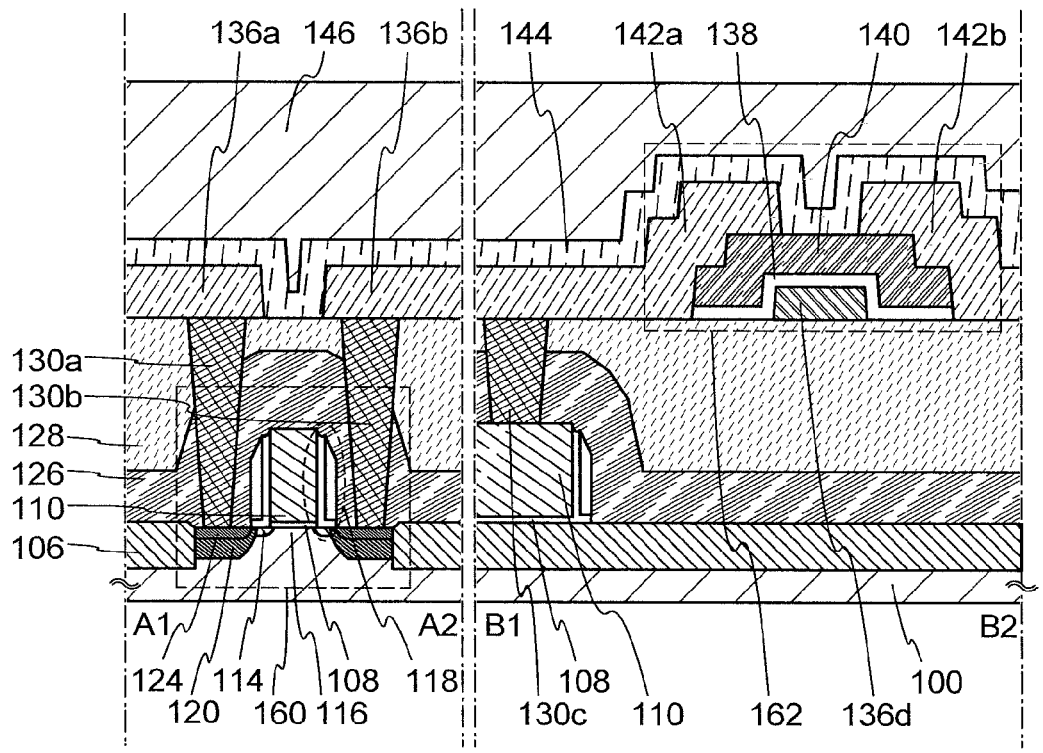

FIGS. 12A and 12B each illustrate an example of the case where the size of the element is relatively large and the gate electrode 136*d* is placed below the oxide semiconductor layer 140. In that case, the required levels for the planarity of a surface and the coverage are relatively moderate, so that it is not necessary to form a wiring, an electrode, and the like to be embedded in an insulating layer. For example, the gate electrode 136*d* and the like can be formed by patterning after formation of a conductive layer. Note that although not shown here, the transistor 160 can be formed in a similar manner.

A big difference between the structure in FIG. 12A and the structure in FIG. 12B is that which of the bottom surface or the top surface of the oxide semiconductor layer 140 the source and drain electrodes 142*a* and 142*b* are in contact with. Moreover, this difference results in other electrodes, an insulating layer, and the like being arranged in a different manner. The details of each component are the same as those of FIGS. 2A and 2B, and the like.

Specifically, the semiconductor device in FIG. 12A includes the gate electrode 136*d* provided over the interlayer insulating layer 128, the gate insulating layer 138 provided over the gate electrode 136*d*, the source and drain electrodes 142*a* and 142*b* provided over the gate insulating layer 138, and the oxide semiconductor layer 140 in contact with top surfaces of the source and drain electrodes 142*a* and 142*b*.

The semiconductor device in FIG. 12B includes the gate electrode 136*d* provided over the interlayer insulating layer 128, the gate insulating layer 138 provided over the gate electrode 136*d*, the oxide semiconductor layer 140 provided over the gate insulating layer 138 in a region overlapping with the gate electrode 136*d*, and the source and drain electrodes 142*a* and 142*b* provided to be in contact with a top surface of the oxide semiconductor layer 140.

Note that also in the structures in FIGS. 12A and 12B, a component can be sometimes omitted from the structure in FIGS. 2A and 2B or the like. Also in that case, an effect of simplification of a manufacturing process can be obtained.

Figure 13A:
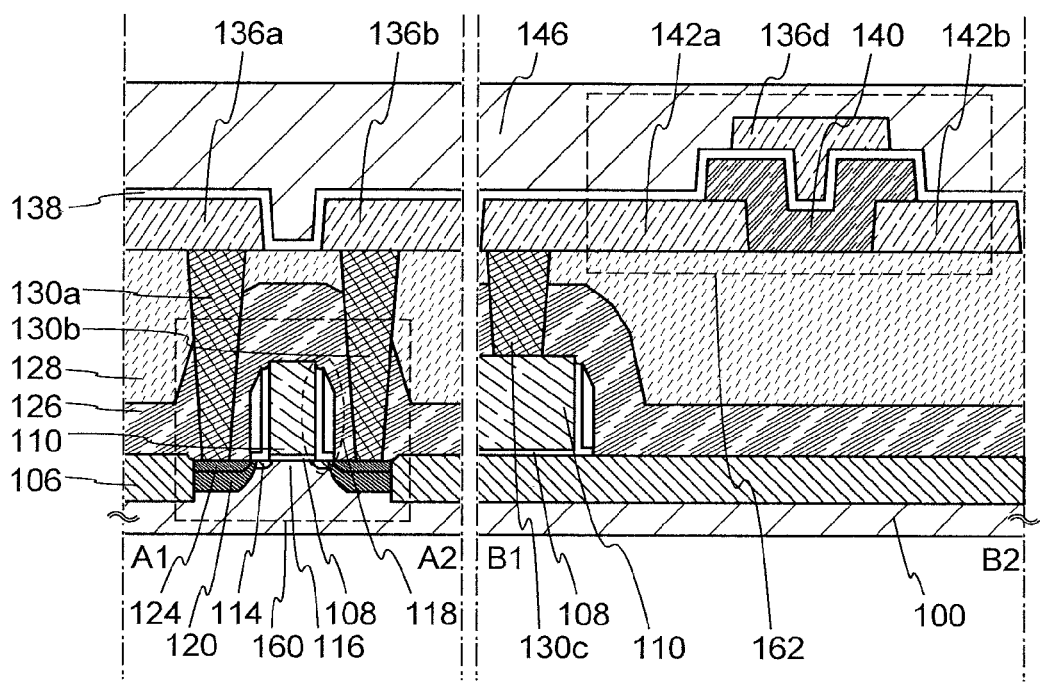
FIGS. 13A and 13B are cross-sectional views each illustrating a semiconductor device.
Figure 13B:
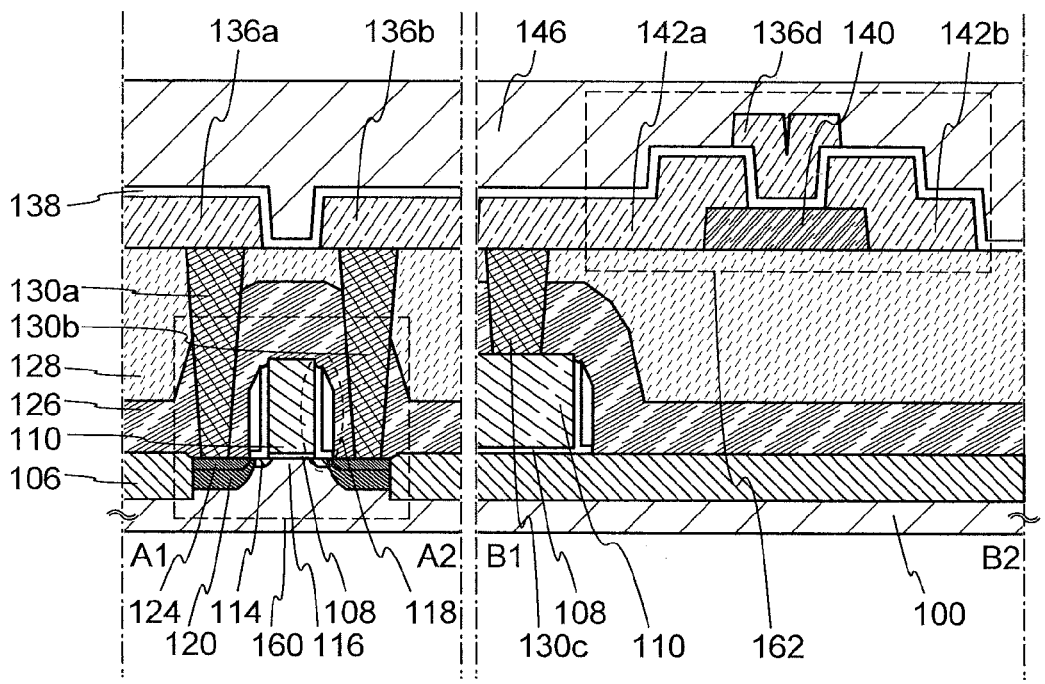

FIGS. 13A and 13B each illustrate an example of the case where the size of the element is relatively large and the gate electrode 136*d* is placed over the oxide semiconductor layer 140. Also in that case, the required levels of the planarity of a surface and the coverage are relatively moderate, so that it is not necessary to form a wiring, an electrode, and the like to be embedded in an insulating layer. For example, the gate electrode 136*d* and the like can be formed by patterning after formation of a conductive layer. Note that although not shown here, the transistor 160 can be formed in a similar manner.

A big difference between the structure in FIG. 13A and the structure in FIG. 13B is that which of the bottom surface or the top surface of the oxide semiconductor layer 140 the source and drain electrodes 142*a* and 142*b* are in contact with. Moreover, this difference results in other electrodes, an insulating layer, and the like being arranged in a different manner. The details of each component are the same as those of FIGS. 2A and 2B, and the like.

Specifically, the semiconductor device in FIG. 13A includes the source and drain electrodes 142*a* and 142*b* provided over the interlayer insulating layer 128, the oxide semiconductor layer 140 in contact with top surfaces of the source and drain electrodes 142*a* and 142*b*, the gate insulating layer 138 provided over the source and drain electrodes 142*a* and 142*b* and the oxide semiconductor layer 140, and the gate electrode 136*d* provided over the gate insulating layer 138 in a region overlapping with the oxide semiconductor layer 140.

The semiconductor device in FIG. 13B includes the oxide semiconductor layer 140 provided over the interlayer insulating layer 128, the source and drain electrodes 142*a* and 142*b* provided to be in contact with a top surface of the oxide semiconductor layer 140, the gate insulating layer 138 provided over the source and drain electrodes 142*a* and 142*b* and the oxide semiconductor layer 140, and the gate electrode 136*d* provided over the gate insulating layer 138 in a region overlapping with the oxide semiconductor layer 140.

Note that in the structures in FIGS. 13A and 13B, a component can be sometimes omitted from the structure in FIGS. 2A and 2B or the like. Also in that case, an effect of simplification of a manufacturing process can be obtained.

As described above, a semiconductor device with a novel structure can be realized according to one embodiment of the present invention. In Embodiment 1, the examples in each of which the semiconductor device is formed by stacking the transistor 160 and the transistor 162 are described; however, the structure of the semiconductor device is not limited to this structure. Moreover, Embodiment 1 shows the examples in each of which the channel length direction of the transistor 160 is perpendicular to that of the transistor 162; however, the positional relation between the transistors 160 and 162 is not limited to this example. The transistor 160 and the transistor 162 may be provided to overlap with each other.

In Embodiment 1, the semiconductor device with a minimum storage unit (one bit) is described for simplification; however, the structure of the semiconductor device is not limited thereto. A more advanced semiconductor device can be formed by connecting a plurality of semiconductor devices as appropriate. For example, a NAND-type or NOR-type semiconductor memory device can be formed by using a plurality of the above-described semiconductor devices. The wiring configuration is not limited to that in FIG. 1 and can be changed as appropriate.

The semiconductor device according to this embodiment can store data for an extremely long time because the off-state current of the transistor 162 is low. That is, refresh operation which is necessary in a DRAM and the like is not needed, so that power consumption can be suppressed. Moreover, the semiconductor device according to this embodiment can be used as a substantially non-volatile storage device.

Since writing or the like of data is performed with switching operation of the transistor 162, high voltage is not necessary and deterioration of the element does not occur. Furthermore, data is written or erased depending on the on/off state of the transistor, whereby high-speed operation can be easily realized. In addition, it is also advantageous in that there is no need of an erase operation for erasing data before the writing operation of writing data, which is necessary in a flash memory and the like.

Since a transistor using a material other than an oxide semiconductor can operate at higher speed than a transistor using an oxide semiconductor, stored data can be read out at high speed by using the former transistor.

The structures and methods described in Embodiment 1 can be combined as appropriate with any of the structures and methods described in the other embodiments.

Embodiment 2

In Embodiment 2, a circuit configuration and operation of a semiconductor device according to one embodiment of the present invention will be described.

Figure 14:
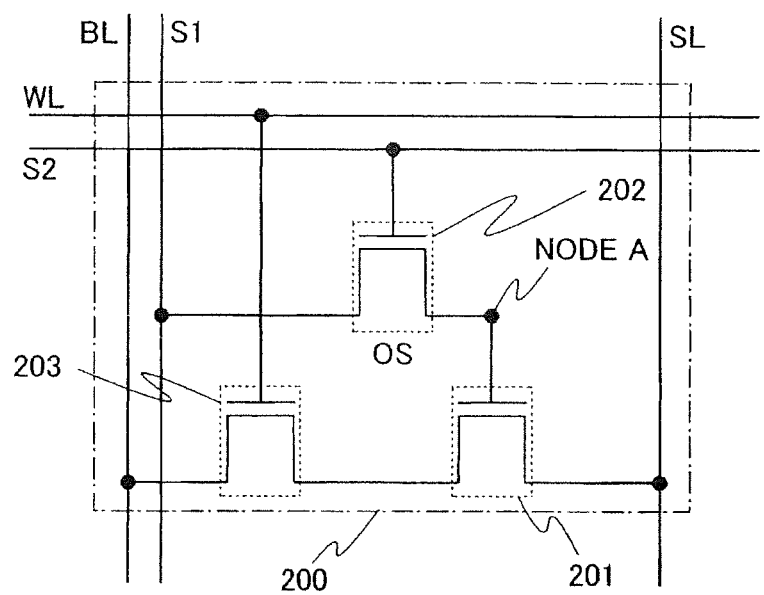
FIG. 14 illustrates a memory cell.

FIG. 14 illustrates an example of a circuit diagram of a semiconductor device (hereinafter also referred to as a memory cell). A memory cell 200 shown in FIG. 14 includes a source line SL, a bit line BL, a first signal line 51, a second signal line S2, a word line WL, a transistor 201, a transistor 202, and a transistor 203. The transistors 201 and 203 are formed using a material other than an oxide semiconductor; the transistor 202 is formed using an oxide semiconductor.

A gate electrode of the transistor 201 and one of a source electrode and a drain electrode of the transistor 202 are electrically connected to each other. The source line SL is electrically connected to a source electrode of the transistor 201, and a drain electrode of the transistor 201 is electrically connected to a source electrode of the transistor 203. The bit line BL is electrically connected to a drain electrode of the transistor 203. The first signal line S1 is electrically connected to the other of the source electrode and the drain electrode of the transistor 202. The second signal line S2 is electrically connected to a gate electrode of the transistor 202. The word line WL is electrically connected to a gate electrode of the transistor 203.

Figure 15:
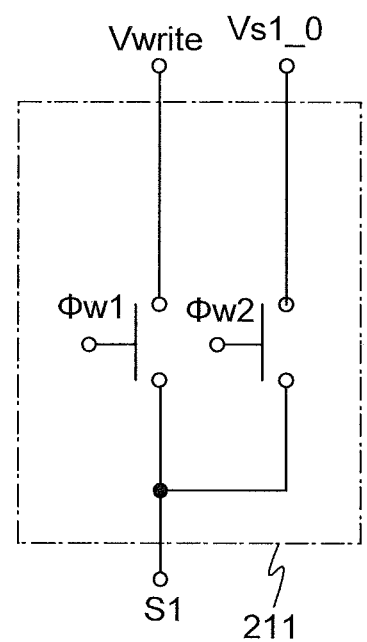
FIG. 15 illustrates a writing circuit.

FIG. 15 illustrates an example of a writing circuit 211. The first signal line S1 is electrically connected to a writing potential Vwrite or Vs1_0 via a switch. The switch is controlled by a signal φw1 or a signal φw2.

Figure 16:
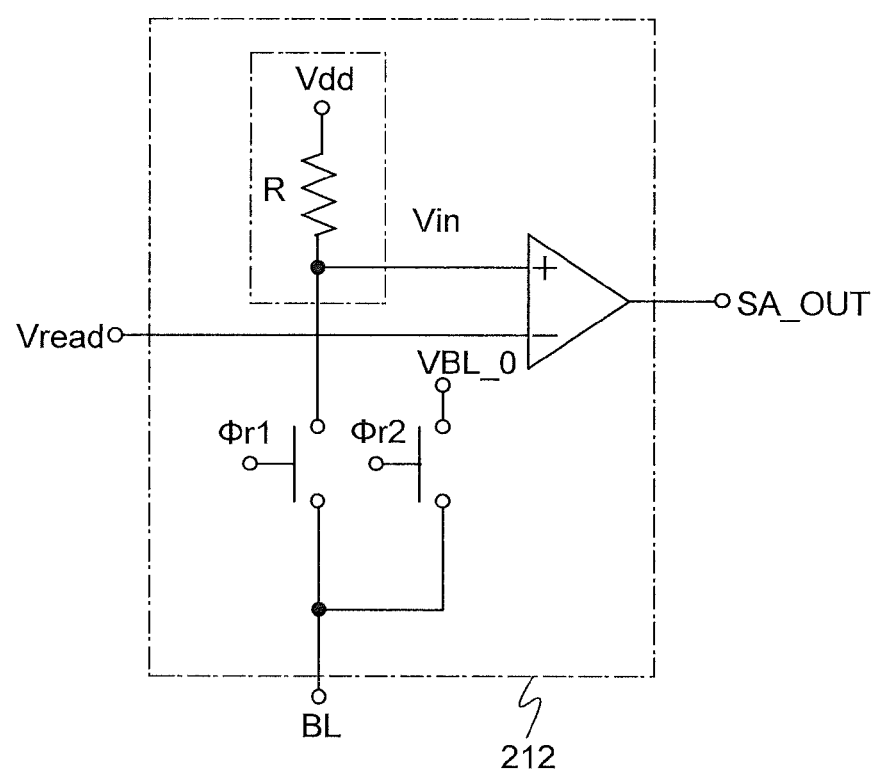
FIG. 16 illustrates a reading circuit.

FIG. 16 illustrates an example of a reading circuit 212. The reading circuit 212 includes a sense amplifier. The reading circuit 212 is electrically connected to the bit line BL. The bit line BL is electrically connected to one terminal of a resistor R via a switch. The other terminal of the resistor R is connected to a potential Vdd. Then, a potential Vin determined by a resistance ratio between the resistor R and a load connected to the bit line BL is input to one input terminal of the sense amplifier. This one input terminal of the sense amplifier is connected to the bit line BL via the switch or the like, and the potential Vin is also referred to as a potential of a bit line. The resistor R is not limited to a resistor element as long as it actually functions as a resistor; the resistor R may be a diode-connected transistor, a transistor whose gate electrode is controlled by another signal, another circuit, or the like. The other input terminal of the sense amplifier is connected to a reading potential Vread. The bit line BL is connected to a potential VBL_0 via a switch. The switches are controlled by a signal φr1 or a signal φr2.

Next, writing operation and reading operation of the memory cell 200 illustrated in FIG. 14 are described. The memory cell 200 can have a variety of states since the effective resistance of the transistor 201 varies depending on electric charge or a potential stored at a node A. Since the off-state current of the transistor 202 is extremely low or substantially zero, the electric charge or the potential at the node A is kept for a long time. In the following description, "writing" refers to electric charge or discharge to/from the node A in the memory cell so that the memory cell has a predetermined state. The term "reading" refers to comparison of a potential that is determined in accordance with the state of the memory cell with a predetermined potential. The terms "writing" and "reading" each also refer to the following meaning depending on the context: "writing" or "data writing" sometimes refers to a series of operations in which predetermined data is written into a memory cell; and "reading" or "data reading" refers to a series of operations in which data stored in a memory cell is read out.

In the case where data is written into the memory cell 200, the potential of the source line SL is set to 0 V and the potential of the word line WL is set to 0 V to turn off the transistor 203, and the potential of the second signal line S2 is set to Vdd to turn on the transistor 202. Further, in the reading circuit 212 that is connected to the bit line BL, the signal φr2 is asserted (enabled) and the signal φr1 is deasserted (disabled). Consequently, the potential VBL_0 is applied to the bit line BL. Further, in the writing circuit 211 that is connected to the first signal line S1, the signal φw2 is deasserted and the signal φw1 is asserted, so that the writing circuit 211 has a writing state. Consequently, the writing potential Vwrite corresponding to data to be written is applied to the first signal line S1. Note that at the end of the writing, before the potential of the first signal line S1 is changed, the potential of the second signal line S2 is set to 0 V to turn off the transistor 202.

As a result, electric charge corresponding to the potential Vwrite of the first signal line S1 is stored at the node A, so that a state corresponding to the data is written. Since the off-state current of the transistor 202 is extremely low or substantially zero, the potential of the gate electrode of the transistor 201 can be held for a long time.

In the case where data is read from the memory cell 200, the potential of the source line SL is set to 0 V and the potential of the word line WL is set to Vdd to turn on the transistor 203, and the potential of the second signal line S2 is set to 0 V to turn off the transistor 202. Further, in the writing circuit 211 that is connected to the first signal line S1, the signal φw2 is asserted and the signal φw1 is deasserted. Consequently, a potential VS1_0 is applied to the first signal line S1. Further, in the reading circuit 212 that is connected to the bit line BL, the signal φr2 is deasserted and the signal φr1 is asserted, so that the reading circuit 212 has a reading state.

In this manner, the effective resistance of the transistor 201 in the memory cell 200 is determined depending on the state of the node A in the memory cell 200. Data reading is performed with the reading circuit 212 by comparing the reading potential Vread with the potential Vin (the potential Vin of the bit line) determined depending on the effective resistance of the transistor 201 in the memory cell 200.

The "potential Vin of the bit line (potential Vin)" compared in the reading circuit includes the potential of a node of the input terminal of the sense amplifier that is connected to the bit line via the switch or the like. In other words, the potential compared in the reading circuit is not necessarily just the same as the potential of the bit line.

Figure 17:
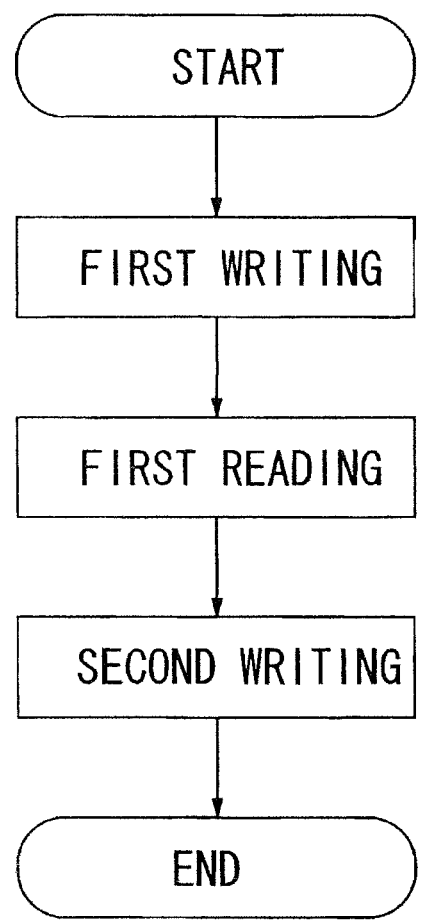
FIG. 17 illustrates a flow of a writing operation.

Next, a writing operation which is one embodiment of the present invention is described. As illustrated in FIG. 17, a writing operation of one embodiment of the present invention includes three steps: first writing (writing for obtaining data on variation), first reading (reading for obtaining data on variation), and second writing (writing for data to be stored). Each of the steps is described below.

The first writing is performed in order to initialize a memory cell so that the memory cell has a predetermined state. Specifically, the above-described writing operation is performed using Vwi (a potential for initialization) as the writing voltage Vwrite.

Figure 18A:
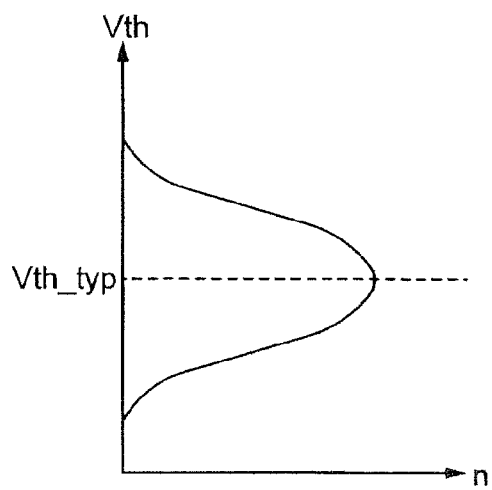
FIGS. 18A and 18B each illustrate distribution of electric charge.

The first reading is performed in order to obtain data on variation in memory cells (data that varies due to differences between or variations among the memory cells). The threshold voltage of the transistor 201 varies between memory cells, and has a distribution illustrated in FIG. 18A, for example.

Figure 18B:
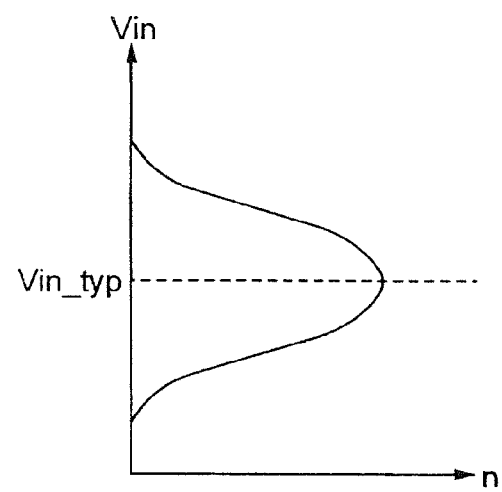

Therefore, the potential Vin of the node of the input terminal of the sense amplifier (or the potential of the bit line BL), which is determined depending on the effective resistance of the memory cell, also varies in the first reading after the first writing is performed; for example, the potential Vin has a distribution illustrated by FIG. 18.

In view of the above, in the first reading, the potential Vin of the bit line BL related to the reading is read out in detail in order to obtain data on variation in memory cells. Specifically, a potential Vri_j (j is an integer greater than or equal to 0 and less than or equal to m) selected from a plurality of potentials Vri_0 to Vri_m is used as the reading potential Vread applied to the sense amplifier in the reading circuit 212, and Vin and Vri_j are compared to each other. This comparison is performed plural times with j in Vri_j changed. Accordingly, it is determined that which section divided by Vri_j (section divided by Vri_j and Vri_(j+1)) the potential Vin of the bit line related to the reading belongs to.

The potential Vri_j (j is an integer greater than or equal to 0 and less than or equal to m) is decided, for example, so as to satisfy Vri_j<Vin<Vri_(j+1) in the case where the threshold voltage Vth of the transistor 201 in the memory cell satisfies the following relation: V0+j×ΔVth<Vth<V0+(j+1)×ΔVth. A section divided by V0+j×ΔVth between V0+i×ΔVth and V0+(i+1)×ΔVth is referred to as Section i (i is an integer greater than or equal to 0 and less than or equal to m−1). The potential Vri_j which satisfies the above-described relation can be decided by simulation or experiment, for example.

V0, m, and ΔVth are decided such that the threshold voltage of the transistor 201 included in a normal memory cell is greater than or equal to V0 and less than or equal to V0+(m+1)×ΔVth. The distribution width of the state of the memory cell after the writing is determined by ΔVth. The smaller the ΔVth is, the narrower the distribution of the state of the memory cell after the writing is. The multi-valued level of data to be written into the memory cell, "n", and a power supply potential and the like are considered for the decision.

The variation on Vri is mainly caused by the variation on the Vth of the transistor 201; however, there may be another cause. That is, even when the Vth of the transistor 201 is fixed, the potential Vin may still have a narrow distribution. Considering that case, for more accuracy, it is preferable to set the potential Vri_j to a representative value of the distribution of Vri_j.

A method for multiple comparisons using a plurality of potentials Vri_0 to Vri_m (m is an integer greater than 0) in the first reading is described below using an example. For example, comparison is performed (m−1) times sequentially with a plurality of potentials Vri_1 to Vri_(m−1), so that it can be determined which section the threshold voltage Vth of the transistor 201 of the memory cell belongs to.

Figure 19:
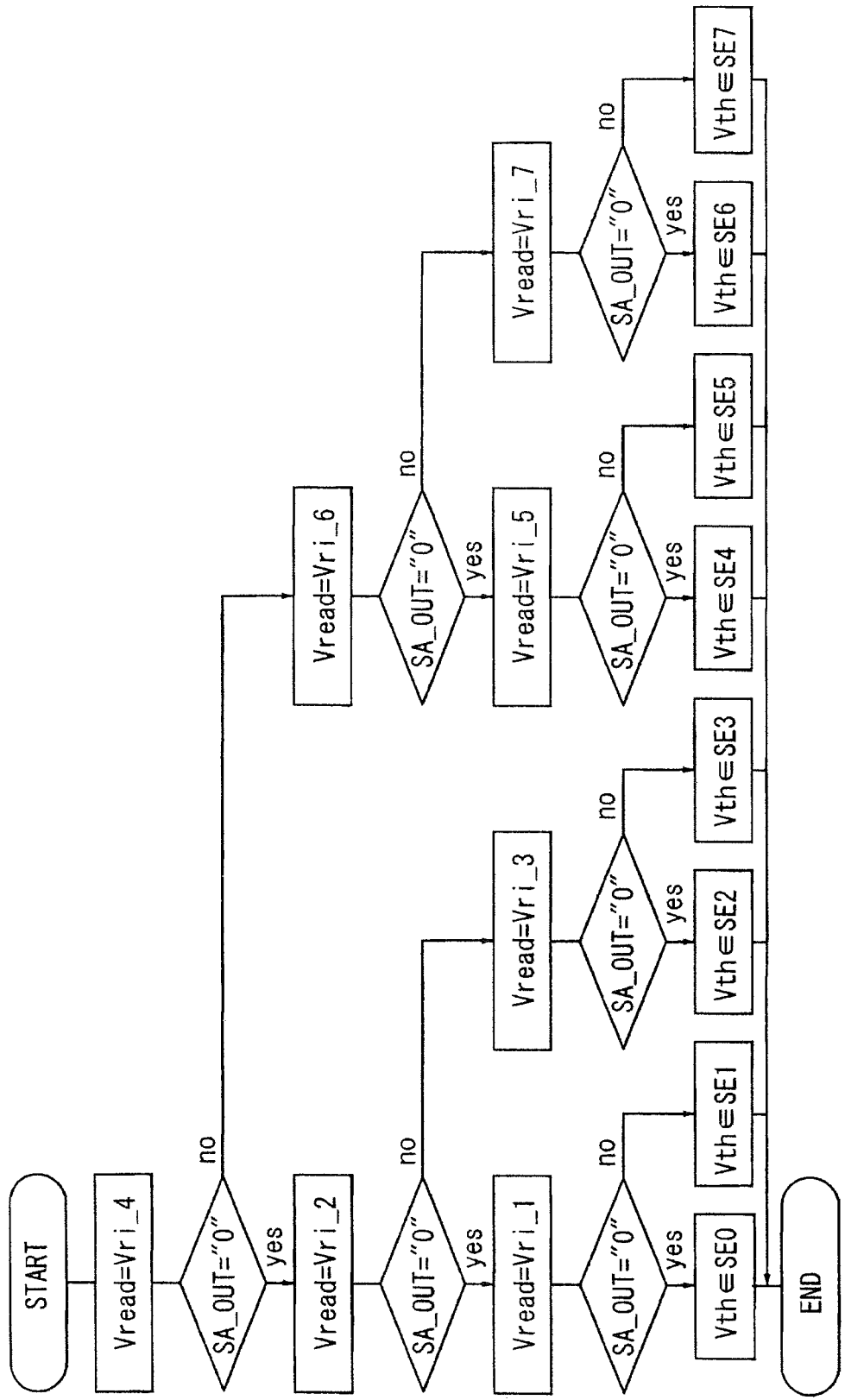
FIG. 19 is a flow chart for illustrating operation.

A method for performing comparison plural times with the use of a comparison result fed back as illustrated in FIG. 19 may be employed. A method in which section the threshold voltage Vth of the transistor 201 of the memory cell belongs to is determined by performing comparison three times in the case where m is 8 is described below using FIG. 19.

First, a potential that is near the center of a plurality of potentials Vri_0 to Vri_8, a potential Vri_4, is used as the reading potential Vread, and first comparison with the potential Vin is performed. When the first comparison results in that the output of the sense amplifier is "0" (SA_OUT="0"), that is, the potential Vin<the potential Vri_4, a potential that is near the center of a plurality of potentials Vri_1 to Vri_4, a potential Vri_2, is used as the reading potential Vread, and second comparison with the potential Vin is performed. On the other hand, when the output of the sense amplifier is "1" (SA_OUT="1"), that is, the potential Vin>the potential Vri_4, a potential that is near the center of a plurality of potentials Vri_4 to Vri_7, a potential Vri_6, is used as the reading potential Vread, and second comparison with the potential Vin is performed.

When the comparison using the potential Vri_2 as the reading potential Vread results in SA_OUT="0", that is, the potential Vin<the potential Vri_2, a potential Vri_1 is used as the reading potential Vread, and third comparison with the potential Vin is performed. Similarly, when SA_OUT="1", that is, the potential Vin>the potential Vri_2, a potential Vri_3 is used as the reading potential Vread, and third comparison with the potential Vin is performed. Similarly, when the comparison using the potential Vri_6 as the reading potential Vread results in SA_OUT="0", that is, the potential Vin<the potential Vri_6, a potential Vri_5 is used as the reading potential Vread, and third comparison with the potential Vin is performed. Similarly, when SA_OUT="1", that is, the potential Vin>the potential Vri_6, a potential Vri_7 is used as the reading potential Vread, and third comparison with the potential Vin is performed.

When the third comparison results in the potential Vin<the potential Vri_1, it can be determined that the threshold voltage Vth of the transistor 201 of the memory cell belongs to Section 0 (SE0). Similarly, it can be determined that the threshold voltage Vth of the transistor 201 of the memory cell belongs to: Section 1 (SE1) when the potential Vin>the potential Vri_1; Section 2 (SE2) when the potential Vin<the potential Vri_3; Section 3 (SE3) when the potential Vin>the potential Vri_3; Section 4 (SE4) when the potential Vin<the potential Vri_5; Section 5 (SE5) when the potential Vin>the potential Vri_5; Section 6 (SE6) when the potential Vin<the potential Vri_7; and Section 7 (SE7) when the potential Vin>the potential Vri_7. In this manner, by performing comparison plural times with a comparison result fed back, the frequency of comparisons can be reduced to M even in the case where the number of sections, m, is $2^M$.

In the case where comparison is performed plural times in the first reading, charging and discharging of the bit line is not involved except in the first comparison, which enables high-speed reading.

Although an example in which comparison is performed plural times is described as a method for comparison using a plurality of potentials Vri_0 to Vri_m (m is an integer greater than 0) above, comparison can be performed only once. Specifically, (m−1) sense amplifiers may be provided in the reading circuit.

Next, in the second writing (writing of data to be stored), predetermined data is written into the memory cell. In this embodiment, n values of "0", "1", . . . "n−1" are written as data. In addition, a writing potential for writing data "i" (i is an integer greater than or equal to 0 and less than or equal to n) in a memory cell in which the threshold voltage of the transistor 201 is a typical value Vth_typ is denoted by Vw_i.

In the second writing, when data "i" is written into a memory cell, the data writing is performed using a writing potential which is corrected (adjusted) on the basis of which section the memory cell belongs to. For example, where the typical value of the threshold voltage of the transistor 201, Vth_typ, belongs to Section i0, a voltage for correction in Section (i0+k) (k is an integer greater than or equal to −i0 and less than or equal to m−1−i0) is k×ΔVth. The threshold voltage and the voltage for correction corresponding to each section of the threshold voltage of the transistor 201 are shown in Table 1.

TABLE 1

| SECTION | THRESHOLD VOLTAGE (V) | VOLTAGE FOR CORRECTION (V) |
|---|---|---|
| 0 | V0~V0 + ΔVth | −i0 × ΔVth |
| 1 | V0 + ΔVth~V0 + 2 × ΔVth | −(i0 − 1) × ΔVth |
| . | . | . |
| . | . | . |
| . | . | . |
| i0 | V0 + i0 × ΔVth~V0 + (i0 + 1) × ΔVth | 0 |
| i0 + 1 | V0 + (i0 + 1) × ΔVth~V0 + (i0 + 2) × ΔVth | ΔVth |
| . | . | . |
| . | . | . |
| . | . | . |
| m − 1 | V0 + (m − 1) × ΔVth~V0 + m × ΔVth | (m − 1 − i0) × ΔVth |

For example, in this embodiment, the voltage for correction is: 0 in Section i0; ΔVth in a next section which is greater than Section i0 by ΔVth; and −ΔVth in a next section which is less than Section i0 by ΔVth. In the case where the memory cell belongs to Section (i0+k), data writing is performed using a corrected writing potential Vw_i+k×ΔVth.

By writing data in this manner, distribution of the state after the writing can be narrowed. As a result, the multi-valued level can be increased. Further, according to the writing operation which is one embodiment of the present invention, which involves just one data writing and data reading at the beginning, high-speed writing can be achieved as compared to a conventional writing operation with verification which involves data writing and data reading plural times.

Figure 20A:
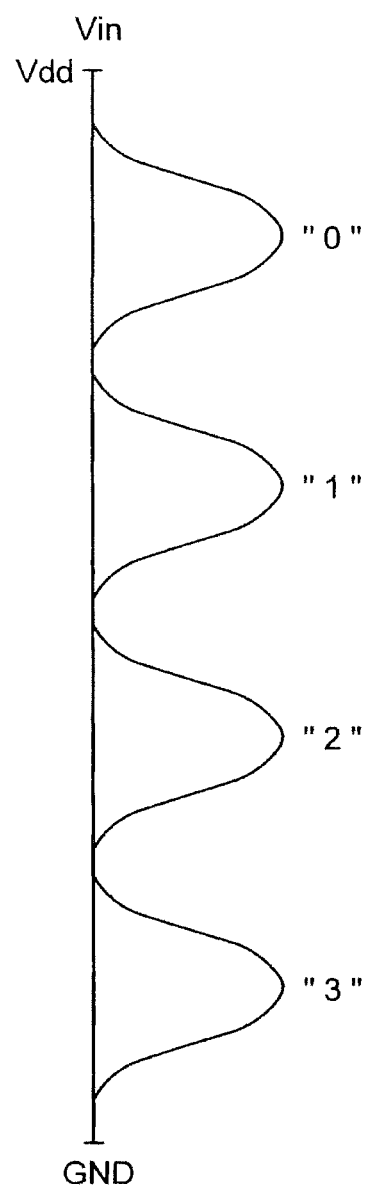
FIG. 20A illustrates an example of a state after data is written without correction.
Figure 20B:
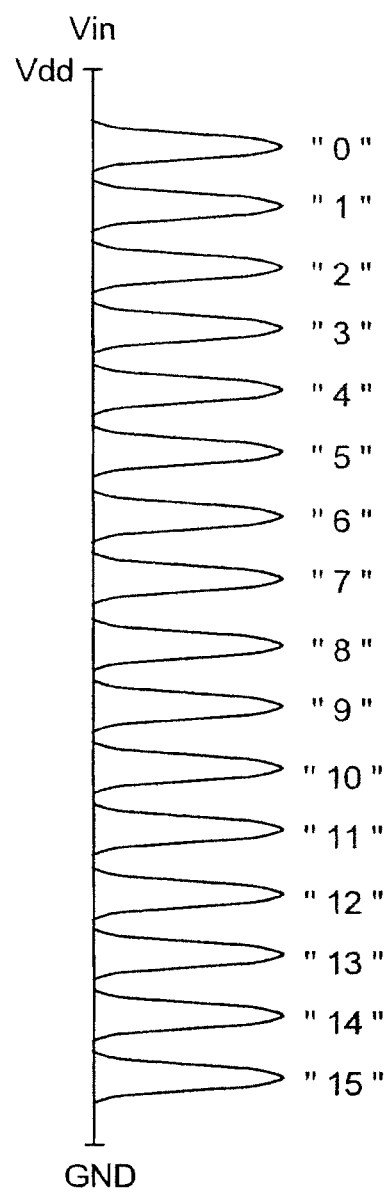
FIG. 20B illustrates an example of a state after data is written with correction.

FIG. 20A illustrates an example after data writing without correction (i.e., in the case where each voltage for correction is 0 V), and FIG. 20B illustrates an example after data writing with correction. In FIG. 20A, the writing potential is fixed regardless of the memory cell, and the state after the writing has a distribution which is a similar degree to a distribution of the threshold voltage of the transistor 201. As a result, for example, the memory cell can states as little as four values. On the other hand, in FIG. 20B, since the writing voltage is corrected for each memory cell, the state after the writing has a narrow distribution of about ΔVth. As a result, for example, the memory cell can store states as large as 16 values.

Next, a reading operation (reading operation of stored data) according to one embodiment of the present invention is described.

In order to read the n values of "0", "1", . . . "n−1" as data, using a potential Vri_j (j is an integer greater than or equal to 0 and less than or equal to n−2) selected from a plurality of potentials Vri_0 to Vri_n−2 (n−2 is an integer greater than 0) as the reading potential Vread, comparison is performed plural times. The reading potential Vri_j is set to a potential between a value of the potential Vin for reading data from the memory cell having data "j" and a value of the potential Vin for reading from the memory cell having data "j+1".

A method for multiple comparisons using a plurality of potentials Vri_0 to Vri_n−2 (n−2 is an integer greater than 0) is described below using an example. For example, comparison is performed (n−1) times sequentially with the plurality of potentials Vri_0 to Vri_n−2, so that it can be determined that which state among respective states of data "0", "1", . . . "n" the memory cell has. Alternatively, a similar method to the method described using FIG. 19 on the first reading can be employed. In that case, the frequency of comparisons for data reading can be reduced. Further alternatively, (n−1) sense amplifiers may be provided, with which data reading can be performed by one comparison.

An example of each specific operating voltage (potential) is shown in Table 2. For example, the multi-valued level n may be 16, the power supply potential Vdd may be 2 V, the typical value of the threshold voltage of the transistor 201, Vth_typ, may be 0.3 V, the section width of the threshold voltage of the transistor 201, ΔVth, may be 0.04 V, the number of sections of the threshold voltage of the transistor 201 and the number of sections of the reading potential Vin of the first reading, m, each may be 8, and the writing potential Vwi of the first writing may be 0.98 V.

TABLE 2

| | |
|---|---|
| MULTI-VALUED LEVEL (n) | 16 |
| POWER SUPPLY POTENTIAL (Vdd) | 2 V |

TABLE 2-continued

| | |
|---|---|
| TYPICAL VALUE OF THRESHOLD VOLTAGE OF TRANSISTOR 201(Vth_typ) | 0.3 V |
| SECTION WIDTH OF THRESHOLD VOLTAGE OF TRANSISTOR 201 (ΔVth) | 0.04 V |
| THE NUMBER OF SECTIONS OF THRESHOLD VOLTAGE OF TRANSISTOR 201 AND THE NUMBER OF SECTIONS IN THE FIRST READING (m) | 8 |
| LOWER LIMIT VALUE OF SECTION 0 OF THRESHOLD VOLTAGE OF TRANSISTOR 201 (V0) | 0.12 V |
| WRITING POTENTIAL IN FIRST WRITING (Vwi) | 0.98 V |
| VBL_0 | 0 V |
| VS1_0 | 0 V |

Further, the following can be used: values described in Table 3 as the voltages for correction corresponding to respective sections of the threshold voltage of the transistor 201; values described in Table 4 as the reading potentials Vri_0 to Vri_8 for the first reading; values described in Table 5 as the writing potentials before correction, Vw_0 to Vw_15 for the second writing; and values described in Table 6 as the reading potentials Vr_0 to Vr_14 for the reading of stored data. By using these voltage values, the writing operation and the reading operation can be performed with Vdd of 2 V or less.

TABLE 3

| SECTION | THRESHOLD VOLTAGE (V) | CORRECTED VALUE (V) |
|---|---|---|
| 0 | 0.12~0.16 | −0.16 |
| 1 | 0.16~0.20 | −0.12 |
| 2 | 0.20~0.24 | −0.08 |
| 3 | 0.24~0.28 | −0.04 |
| 4 | 0.28~0.32 | 0 |
| 5 | 0.32~0.36 | 0.04 |
| 6 | 0.36~0.40 | 0.08 |
| 7 | 0.40~0.44 | 0.12 |

TABLE 4

| Vri_i(V) | |
|---|---|
| Vri_0 | 1.52 |
| Vri_1 | 1.56 |
| Vri_2 | 1.6 |
| Vri_3 | 1.64 |
| Vri_4 | 1.68 |
| Vri_5 | 1.72 |
| Vri_6 | 1.75 |
| Vri_7 | 1.78 |
| Vri_8 | 1.87 |

TABLE 5

| Vw_i(V) | |
|---|---|
| Vw_0 | 0.16 |
| Vw_1 | 0.48 |
| Vw_2 | 0.58 |
| Vw_3 | 0.68 |
| Vw_4 | 0.78 |
| Vw_5 | 0.88 |
| Vw_6 | 0.98 |
| Vw_7 | 1.08 |
| Vw_8 | 1.18 |
| Vw_9 | 1.28 |
| Vw_10 | 1.38 |
| Vw_11 | 1.48 |
| Vw_12 | 1.58 |
| Vw_13 | 1.68 |

TABLE 5-continued

| Vw_i(V) | |
|---|---|
| Vw_14 | 1.78 |
| Vw_15 | 1.88 |

TABLE 6

| Vr_i(V) | |
|---|---|
| Vr_0 | 1.98 |
| Vr_1 | 1.96 |
| Vr_2 | 1.92 |
| Vr_3 | 1.88 |
| Vr_4 | 1.82 |
| Vr_5 | 1.74 |
| Vr_6 | 1.64 |
| Vr_7 | 1.54 |
| Vr_8 | 1.44 |
| Vr_9 | 1.3 |
| Vr_10 | 1.16 |
| Vr_11 | 1.02 |
| Vr_12 | 0.86 |
| Vr_13 | 0.68 |
| Vr_14 | 0.5 |

As described above, the writing operation of one embodiment of the present invention includes the three steps: the first writing (writing for obtaining data on variation), the first reading (reading for obtaining data on variation), and the second writing (writing for data to be stored). Data on variation of the memory cell is obtained through the first writing and the first reading, and predetermined data is written into the memory cell with the use of a writing voltage which is corrected on the basis of the data on variation of the memory cell in the second writing. Accordingly, the distribution of the state after the writing operation can be narrowed.

Figure 21:
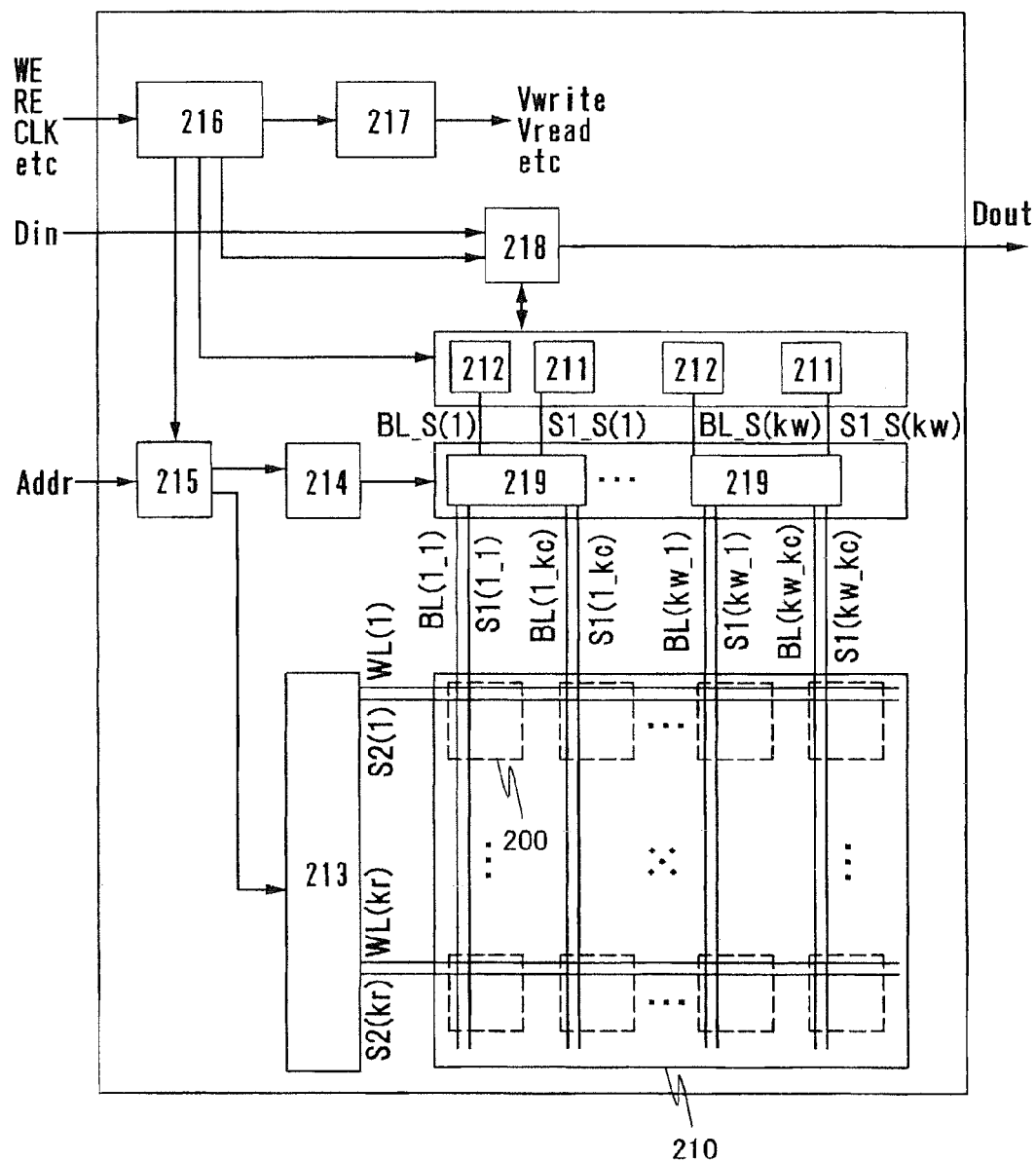
FIG. 21 illustrates a semiconductor device.

FIG. 21 illustrates an example of a block circuit diagram of a semiconductor device according to one embodiment of the present invention, including a memory cell array of kr×(kc×kw). For example, in the case where the multi-valued level n is 4, the storage capacity is 2×kr×(kc×kw) bits, and in the case where the multi-valued level n is 16, the storage capacity is 4×kr×(kc×kw) bits. Generally, in the case where the multi-valued level n is $2^k$ (k is an integer greater than or equal to 1), the memory capacity is k times as large as that in the case where the multi-valued level is two.

The semiconductor device illustrated in FIG. 21 includes: kr word lines WL and kr second signal lines S2; kc×kw bit lines BL(1_1) to BL(kw_kc) and kc×kw first signal lines S1(1_1) to S1(kw_kc); a memory cell array 210 in which a plurality of memory cells 200(1, 1) to 200(kr, kw_kc) is arranged in a matrix of kr (row)×kc×kw (column) (kr, kc, and kw are each a natural number); and peripheral circuits such as a reading circuit 212, a writing circuit 211, a plurality of multiplexers 219, a driver circuit 213 for a second signal and a word line, a column decoder 214, an address buffer 215, a data buffer 218, a potential generating circuit 217, and a control circuit 216. As another peripheral circuit, a refresh circuit or the like may be provided. Note here that kr is the number of columns selected independently by the column decoder 214, and kw is the number of columns selected at the same time.

The circuit shown in FIG. 14 can be applied to the memory cell 200. A memory cell 200(i, j) (i is an integer greater than or equal to 1 and less than or equal to kr and j is an integer greater than or equal to 1 and less than or equal to kc×kw), which is used typically as each memory cell in this embodiment, is connected to a bit line BL(j), the first signal line S1(j), the word line WL(i), the second signal line S2(i), and the source wiring. Further, the bit lines BL(1_1) to BL(kw_kc) and the first signal lines S1(1_1) to S1 (kw_kc) are connected to the multiplexers 219. The word lines WL(1) to WL(kr) and the second signal lines S2(1) to S2(kr) are connected to the driver circuit 213 for a second signal line and a word line.

Next, each circuit is described. The circuit shown in FIG. 15 and the circuit shown in FIG. 16 can be applied to the writing circuit 211 and the reading circuit 212, respectively.

The multiplexer 219 inputs an output signal of the column decoder 214 as a control signal and connects a bit line selected from the kc bit lines to the reading circuit 212. Specifically, one signal among kc control signals is asserted, and a bit line which is controlled by the asserted control signal is connected to a line BL_S. The multiplexer 219 also connects a first signal line selected from the kc first signal lines to the writing circuit 211. Specifically, one signal among kc control signals is asserted, and a first signal line which is controlled by the asserted control signal is connected to a line S1_S.

The column decoder 214 uses a column address output from the address buffer 215, a control signal output from the control circuit 216, or the like as an input signal, and asserts one output signal specified by the address and deasserts other output signals.

In the case of a semiconductor device in which kc is 1, the column decoder 214 and the multiplexer 219 are not necessarily provided. In that case, the writing circuit 211 may be directly connected to the first signal line 51 and the reading circuit 212 may be directly connected to the bit line BL.

The driver circuit 213 for a second signal line and a word line uses a row address output from the address buffer 215, a control signal output from the control circuit 216, or the like as an input signal, and applies respective predetermined potentials to a word line and a second signal line specified by the address and other word lines and other second signal lines.

The potential generating circuit 217 outputs a writing potential Vwrite, a reading potential Vread, VBL_0, VS1_0, or the like in accordance with a control signal output from the control circuit 216. As the writing potential Vwrite, Vwi and a writing potential Vw_j (j is an integer greater than or equal to 0 and less than or equal to (n−1)) which is corrected in accordance with writing data and the result of the first reading are output in the first writing and the second writing, respectively. As the reading potential Vread, a potential Vr_j (j is an integer greater than or equal to 0 and less than or equal to (n−2)) and a potential Vri_j (j is an integer greater than or equal to 0 and less than or equal to (m+1)) are output in the data reading operation and the first reading, respectively. These potentials are specified by the output signal of the control circuit. For example, a digital-analog converter (DAC) which uses as an input signal, a digital signal having a voltage level output from the control circuit may be provided.

The potential generating circuit 217 may output a plurality of writing potentials Vwrite and a plurality of reading potentials Vread. For example, in the case where a plurality of writing circuits 211 is provided and different potentials are written thereto, appropriate potentials can be supplied to the writing circuits 211 by the plurality of writing potentials Vwrite. On the other hand, for example, in the case where a plurality of reading circuits 212 is provided and a method for performing comparison plural times with a comparison result fed back as illustrated in FIG. 19 is used, appropriate potentials can be supplied to the reading circuits 212 by the plurality of reading potentials Vread.

The address buffer 215 uses an address signal input to the semiconductor device or the control signal output from the control signal circuit as an input signal and outputs a predetermined column address or a predetermined row address at a predetermined timing in accordance with the control signal. An address register may be provided.

The data buffer 218 uses a signal Din input to the semiconductor device, an output signal from the reading circuit 212, or the control signal output from the control circuit 216 as an input signal and outputs a signal input to the writing circuit 211, a signal Dout output from the semiconductor device, or a signal input to the control circuit 216 as an output signal. The data buffer 218 includes a data register, and stores each input signal into the data register at a predetermined timing in accordance with the control signal. The output signal input to the control circuit 216 is a signal for selecting the writing potential Vwrite or the reading potential Vread, which is, for example, data to be written into the memory cell or data read out from the memory cell.

The control circuit 216 uses a signal input to the semiconductor device, such as WE, RE, or CLK, or the output signal from the data buffer 218 as an input signal, and outputs a variety of control signals as an output signal, to the potential generating circuit 217, the address buffer 215, the data buffer 218, the column decoder 214, the driver circuit 213 for a second signal line and a word line, or the like. The control signal is a timing control signal for performing the data writing operation or the data reading operation or a control signal having data such as a potential to be used. In particular, in the second writing, data on the corrected writing potential is generated from data on the writing potential and data on the voltage for correction and the data is output. The control circuit 216 may include a ROM for generating data on the corrected writing potential from data on the writing potential and data on the voltage for correction. For example, in the case where data on the writing potential is 4 bits, data on the voltage for correction is 3 bits, and data on the corrected writing potential is 6 bits, a 8 Kbit ROM may be provided. Alternatively, an arithmetic circuit for generating data on the corrected writing potential from data on the writing potential and data on the voltage for correction may be provided.

Although the reading potential Vread is generated in the potential generating circuit 217 in this embodiment, the reading potential Vread may be generated by another structure. For example, a memory cell and a reference circuit having the same configuration as a circuit for generating Vin may be provided, and the potential of the node A of the memory cell included in the reference circuit may be controlled to generate the reading potential Vread. Further, although the reading circuit 212 includes one sense amplifier in this embodiment, a plurality of sense amplifiers may be provided. By providing a plurality of sense amplifiers in the reading circuit 212, the frequency of readings can be reduced.

The semiconductor device according to this embodiment can store data for an extremely long time because the off-state current of the transistor 202 is low. That is, refresh operation which is necessary in a DRAM and the like is not needed, so that power consumption can be suppressed. Moreover, the semiconductor device according to this embodiment can be used as a non-volatile memory device substantially.

Further, since data writing or the like is performed with switching operation of the transistor 202, high voltage is not necessary and deterioration of the element does not occur. Furthermore, since data is written or erased depending on on/off of the transistor, high-speed operation can be easily realized. Further, it is possible to rewrite data directly by controlling the potential to be input to the transistor. For that reason, erasing operation which is necessary for a flash memory or the like is not needed, so that a reduction in operation speed due to erasing operation can be prevented.

Further, by using a transistor that uses a material which is not an oxide semiconductor and can operate at higher speed than a transistor using an oxide semiconductor, stored data can be read out at high speed.

Further, since the semiconductor device according to this embodiment is a multi-valued type, the storage capacity per unit area can be increased. Accordingly, size reduction and high integration of a semiconductor device can be achieved.

As described above, data on variation of the memory cell is obtained and a writing potential in accordance with the variation data is written into the memory cell, whereby the distribution of the state of the memory cell after the data writing can be narrowed. Accordingly, the multi-valued level can be increased. According to the writing operation which is one embodiment of the present invention, the potential of the node which has a floating state can be directly controlled, so that the threshold voltage can be controlled with a high degree of accuracy by the writing operation having three steps of the first writing, the first reading, and the second writing. Accordingly, high-speed writing can be realized as compared to a conventional writing operation with verification which involves data writing and data reading plural times.

Embodiment 3

In Embodiment 3, examples of electronic devices each including the semiconductor device according to any of the above-described embodiments will be described with reference to FIGS. 22A to 22F. The semiconductor device according to the above embodiment can hold data even when power is not supplied. Moreover, degradation due to writing or erasing does not occur. Furthermore, the semiconductor device can operate at high speed. For these reasons, an electronic device with a novel structure can be provided by using the semiconductor device. The semiconductor devices according to any of the above embodiments are integrated and mounted on a circuit board or the like, and placed inside an electronic device.

Figure 22A:
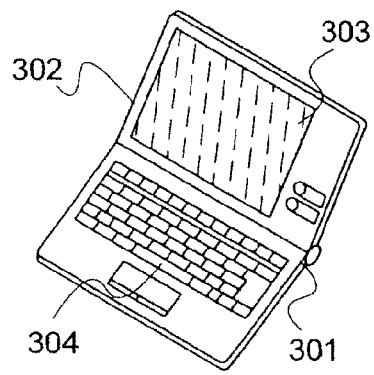
FIGS. 22A to 22F each illustrate an electronic device.

FIG. 22A illustrates a notebook personal computer including the semiconductor device according to the above embodiment. The notebook personal computer includes a main body 301, a housing 302, a display portion 303, a keyboard 304, and the like. The semiconductor device according to one embodiment of the present invention is applied to a notebook personal computer, whereby the notebook personal computer can hold data even when power is not supplied. Moreover, degradation due to writing or erasing does not occur. Further, the notebook personal computer can operate at high speed. For these reasons, it is preferable to apply the semiconductor device according to one embodiment of the present invention to a notebook personal computer.

Figure 22D:
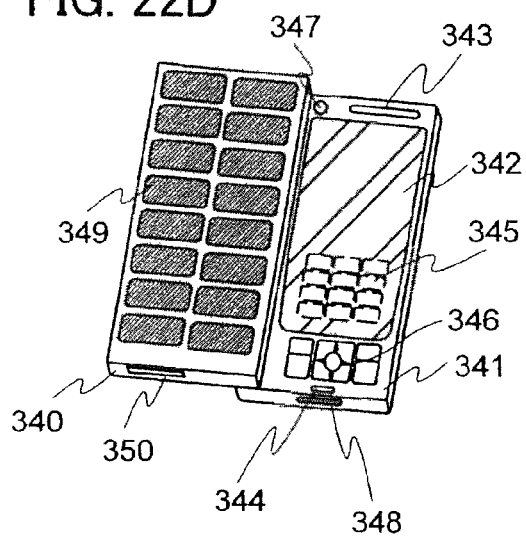
Figure 22B:
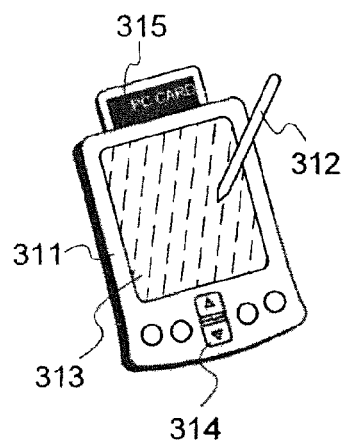

FIG. 22B illustrates a personal digital assistant (PDA) including the semiconductor device according to the above embodiment. A main body 311 is provided with a display portion 313, an external interface 315, operation buttons 314, and the like. A stylus 312 that is an accessory is used for operating the PDA. The semiconductor device according to one embodiment of the present invention is applied to a PDA, whereby the PDA can hold data even when power is not supplied. Moreover, degradation due to writing or erasing does not occur. Further, the PDA can operate at high speed. For these reasons, it is preferable to apply the semiconductor device according to one embodiment of the present invention to a PDA.

Figure 22E:
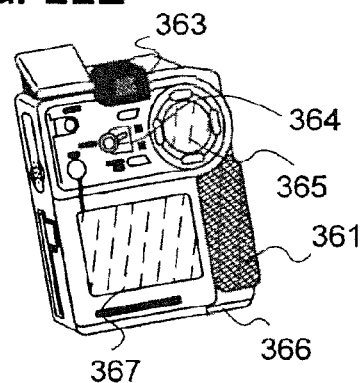
Figure 22C:
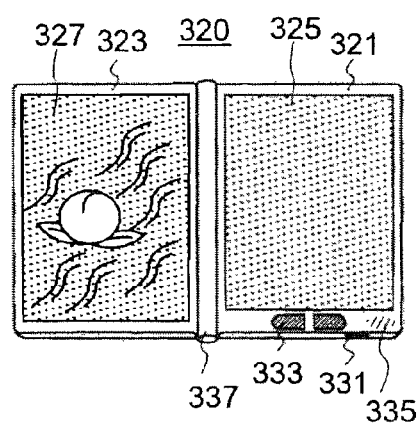

FIG. 22C illustrates an e-book reader 320 as an example of electronic paper including the semiconductor device according to the above embodiment. The e-book reader 320 includes two housings: a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. The semiconductor device according to one embodiment of the present invention is applied to electronic paper, whereby the electronic paper can hold data even when power is not supplied. Moreover, degradation due to writing or erasing does not occur. Further, the electronic paper can operate at high speed. For these reasons, it is preferable to apply the semiconductor device according to one embodiment of the present invention to electronic paper.

A display portion 325 is incorporated in the housing 321 and a display portion 327 is incorporated in the housing 323. The display portion 325 and the display portion 327 may display one image or different images. When the display portion 325 and the display portion 327 display different images, for example, the right display portion (the display portion 325 in FIG. 22C) can display text and the left display portion (the display portion 327 in FIG. 22C) can display images.

FIG. 22C illustrates an example in which the housing 321 is provided with an operation portion and the like. For example, the housing 321 is provided with a power switch 331, operation keys 333, a speaker 335, and the like. Pages can be turned with the operation key 333. Note that a keyboard, a pointing device, or the like may also be provided on the surface of the housing, on which the display portion is provided. Furthermore, an external connection terminal (e.g., an earphone terminal, a USB terminal, or a terminal that can be connected to various cables such as an AC adapter and a USB cable), a recording medium insertion portion, and the like may be provided on the rear surface or the side surface of the housing. Further, the e-book reader 320 may have a function of an electronic dictionary.

The e-book reader 320 may send and receive data wirelessly. Through wireless communication, book data or the like can be purchased and downloaded from an electronic book server.

Electronic paper can be applied to devices in a variety of fields as long as they display information. For example, electronic paper can be used for posters, advertisement in vehicles such as trains, display in a variety of cards such as credit cards, and the like in addition to e-book readers.

FIG. 22D illustrates a mobile phone including the semiconductor device according to the above embodiment. The mobile phone includes two housings: a housing 340 and a housing 341. The housing 341 is provided with a display panel 342, a speaker 343, a microphone 344, a pointing device 346, a camera lens 347, an external connection terminal 348, and the like. The housing 340 is provided with a solar cell 349 for charging the mobile phone, an external memory slot 350, and the like. In addition, an antenna is incorporated in the housing 341. The semiconductor device according to one embodiment of the present invention is applied to a mobile phone, whereby the mobile phone can hold data even when power is not supplied. Moreover, degradation due to writing or erasing does not occur. Further, the mobile phone can operate at high speed. For these reasons, it is preferable to apply the semiconductor device according to one embodiment of the present invention to a mobile phone.

The display panel 342 has a touch panel function. A plurality of operation keys 345 displayed as images are shown by dashed lines in FIG. 22D. The mobile phone includes a booster circuit for boosting a voltage output from the solar cell 349 to a voltage necessary for each circuit. Moreover, the mobile phone can include a contactless IC chip, a small recording device, or the like in addition to the above structure.

The direction of display on the display panel 342 is changed as appropriate depending on applications. Further, the camera lens 347 is provided on the same surface as the display panel 342, so that the mobile phone can be used as a videophone. The speaker 343 and the microphone 344 can be used for videophone calls, recording and playing sound, and the like as well as voice calls. Moreover, the housings 340 and 341 in a state where they are developed as illustrated in FIG. 22D can be slid so that one is lapped over the other. Therefore, the size of the mobile phone can be reduced, which makes the mobile phone suitable for being carried.

The external connection terminal 348 can be connected to a variety of cables such as an AC adapter or a USB cable, so that the mobile phone can be charged or can perform data communication. Moreover, the mobile phone can store and move a larger amount of data by inserting a recording medium into the external memory slot 350. Further, the mobile phone may have an infrared communication function, a television reception function, or the like in addition to the above functions.

FIG. 22E illustrates a digital camera including the semiconductor device according to the above embodiment. The digital camera includes a main body 361, a display portion (A) 367, an eyepiece portion 363, an operation switch 364, a display portion (B) 365, a battery 366, and the like. The semiconductor device according to one embodiment of the present invention is applied to a digital camera, whereby the digital camera can hold data even when power is not supplied. Moreover, degradation due to writing or erasing does not occur. Further, the digital camera can operate at high speed. For these reasons, it is preferable to apply the semiconductor device according to one embodiment of the present invention to a digital camera.

Figure 22F:
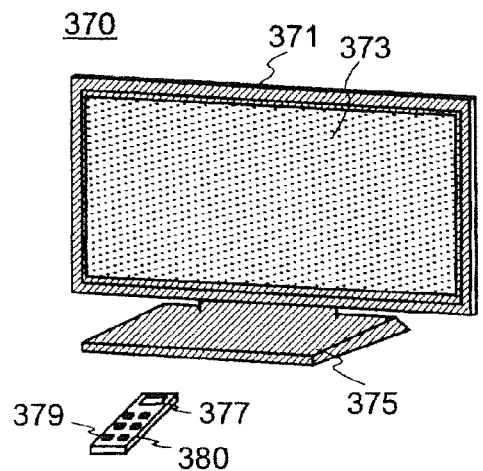

FIG. 22F illustrates a television set including the semiconductor device according to the above embodiment. In a television set 370, a display portion 373 is incorporated in a housing 371. Images can be displayed on the display portion 373. The housing 371 is supported by a stand 375 in the structure shown in FIG. 22F.

The television set 370 can be operated by an operation switch of the housing 371 or a separate remote controller 380. With operation keys 379 of the remote controller 380, channels and volume can be controlled and images displayed on the display portion 373 can be controlled. Moreover, the remote controller 380 may include a display portion 377 for displaying data output from the remote controller 380. The semiconductor device according to one embodiment of the present invention is applied to a television set, whereby the television set can hold data even when power is not supplied. Moreover, degradation due to writing or erasing does not occur. Furthermore, the television set can operate at high speed. For these reasons, it is preferable to apply the semiconductor device according to one embodiment of the present invention to a television set.

Note that the television set 370 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

The structures and methods described in Embodiment 3 can be combined as appropriate with any of the structures and methods described in the other embodiments.

This application is based on Japanese Patent Application serial No. 2009-260341 filed with Japan Patent Office on Nov. 13, 2009, the entire contents of which are hereby incorporated by reference.

What is claimed is:

1. A semiconductor device comprising:
   a source line;
   a first bit line;
   a first word line;
   a memory cell connected to the source line, the first bit line and the first word line;
   a driver circuit configured to drive the first word line so as to select the memory cell specified by an address signal;
   a reading circuit comprising a plurality of comparing circuits; and
   a potential generating circuit configured to generate a plurality of reading potentials to supply to the reading circuit,
   wherein the memory cell comprises a first transistor and a second transistor,
   wherein a gate of the first transistor is configured to hold a written potential in accordance with data to be held in the memory cell,
   wherein the second transistor is configured to control electrical connection between the gate of the first transistor and an external circuit out of the memory cell,
   wherein the first transistor is provided in a substrate containing a semiconductor material,
   wherein the second transistor comprises a layer comprising crystal grains of an oxide semiconductor,
   wherein the second transistor is provided over the first transistor with an insulating layer therebetween,
   wherein c-axis of the crystal grains are perpendicular to a surface of the layer,
   wherein each of the plurality of comparing circuits is configured to compare a potential of the first bit line and one of the plurality of reading potentials, and
   wherein the written potential is determined in accordance with a threshold voltage of the first transistor.

2. The semiconductor device according to claim 1, further comprising a control circuit configured to select one of a plurality of voltages for correction on a basis of comparison results between the potential of the first bit line and the plurality of reading potentials.

3. The semiconductor device according to claim 1, further comprising a second bit line,
   wherein the second transistor is configured to control electrical connection between the gate of the first transistor and the second bit line.

4. The semiconductor device according to claim 3, further comprising a writing circuit configured to output a writing potential to the second bit line.

5. The semiconductor device according to claim 1, further comprising a third transistor in the memory cell,
wherein the third transistor is configured to control electrical connection between the source line and the first bit line.

6. The semiconductor device according to claim 1, wherein each of the plurality of comparing circuits is a sense amplifier.

7. The semiconductor device according to claim 1, further comprising a second word line,
wherein the second transistor is controlled by the second word line.

8. A driving method for the semiconductor device according to claim 1, comprising steps of:
applying a first potential to the first bit line;
applying a second potential to the source line;
supplying the address signal to the first word line so that the potential of the first bit line changes in accordance with a resistance between a source and a drain of the first transistor, the resistance depending on the written potential; and
deciding a range of the potential of the first bit line at the reading circuit after the supplying the address signal to the first word line.

9. The semiconductor device according to claim 1, wherein an off-state current of the second transistor be $1 \times 10^{-13}$ A or less.

10. A semiconductor device comprising:
a source line;
a first bit line;
a first word line;
a memory cell connected to the source line, the first bit line and the first word line;
a driver circuit configured to drive the first word line so as to select the memory cell specified by an address signal; and
a reading circuit comprising a plurality of comparing circuits,
wherein the memory cell comprises a first transistor and a second transistor,
wherein a gate of the first transistor is configured to hold a written potential in accordance with data to be held in the memory cell,
wherein the second transistor is configured to control electrical connection between the gate of the first transistor and an external circuit out of the memory cell,
wherein the first transistor is provided in a substrate containing a semiconductor material,
wherein the second transistor comprises a layer comprising crystal grains of an oxide semiconductor,
wherein the second transistor is provided over the first transistor with an insulating layer therebetween,
wherein c-axis of the crystal grains are perpendicular to a surface of the layer,
wherein the reading circuit is configured to be supplied with a plurality of reading potentials,
wherein each of the plurality of comparing circuits is configured to compare a potential of the first bit line and one of the plurality of reading potentials, and
wherein the written potential is determined in accordance with a threshold voltage of the first transistor.

11. The semiconductor device according to claim 10, further comprising a control circuit configured to select one of a plurality of voltages for correction on a basis of comparison results between the potential of the first bit line and the plurality of reading potentials.

12. The semiconductor device according to claim 10, further comprising a second bit line, wherein the second transistor is configured to control electrical connection between the gate of the first transistor and the second bit line.

13. The semiconductor device according to claim 12, further comprising a writing circuit configured to output a writing potential to the second bit line.

14. The semiconductor device according to claim 10, further comprising a third transistor in the memory cell, wherein the third transistor is configured to control electrical connection between the source line and the first bit line.

15. The semiconductor device according to claim 10, wherein each of the plurality of comparing circuits is a sense amplifier.

16. The semiconductor device according to claim 10, further comprising a second word line,
wherein the second transistor is controlled by the second word line.

17. A driving method for the semiconductor device according to claim 10, comprising steps of:
applying a first potential to the first bit line;
applying a second potential to the source line;
supplying the address signal to the first word line so that the potential of the first bit line changes in accordance with a resistance between a source and a drain of the first transistor, the resistance depending on the written potential; and
deciding a range of the potential of the first bit line at the reading circuit after the supplying the address signal to the first word line.

18. The semiconductor device according to claim 10, wherein an off-state current of the second transistor be $1 \times 10^{-13}$ A or less.

* * * * *